(12) United States Patent
Liu et al.

(10) Patent No.: US 12,034,072 B2
(45) Date of Patent: *Jul. 9, 2024

(54) SEMICONDUCTOR DEVICES HAVING UNIT CELL TRANSISTORS WITH SMOOTHED TURN-ON BEHAVIOR AND IMPROVED LINEARITY

(71) Applicant: MACOM Technology Solutions Holdings, Inc., Lowell, MA (US)

(72) Inventors: Yueying Liu, Morrisville, NC (US); Saptharishi Sriram, Cary, NC (US); Scott Sheppard, Chapel Hill, NC (US); Jennifer Gao, Burlington, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 227 days.

This patent is subject to a terminal disclaimer.

(21) Appl. No.: 17/190,559

(22) Filed: Mar. 3, 2021

(65) Prior Publication Data

US 2021/0193825 A1     Jun. 24, 2021

Related U.S. Application Data

(60) Division of application No. 16/194,760, filed on Nov. 19, 2018, now Pat. No. 10,978,583, which is a
(Continued)

(51) Int. Cl.
*H01L 23/528* (2006.01)
*H01L 23/522* (2006.01)
(Continued)

(52) U.S. Cl.
CPC ........ *H01L 29/7787* (2013.01); *H01L 27/085* (2013.01); *H01L 29/0696* (2013.01);
(Continued)

(58) Field of Classification Search
CPC ......... H01L 29/66431; H01L 29/66462; H01L 29/778–7789; H01L 2924/13064; H01L 29/122–127; H01L 29/15–158
See application file for complete search history.

(56) References Cited

U.S. PATENT DOCUMENTS 3,586,930 A     6/1971  Das et al.
5,459,684 A  *  10/1995 Nakamura .......... G11C 11/4074
                                                         365/201
(Continued)

FOREIGN PATENT DOCUMENTS

EP       2040299 A1    3/2009
JP     H09115926 A     5/1997
(Continued)

OTHER PUBLICATIONS

"International Preliminary Report on Patentability for corresponding International Application No. PCT/US2018/037760, dated: Dec. 24, 2019, 9 pgs".

(Continued)

*Primary Examiner* — Mary A Wilczewski
*Assistant Examiner* — Tsz K Chiu
(74) *Attorney, Agent, or Firm* — Myers Bigel, P.A.

(57) ABSTRACT

A semiconductor device includes a plurality of unit cell transistors on a common semiconductor structure, the unit cell transistors electrically connected in parallel, and each unit cell transistor including a respective gate finger. Respective threshold voltages of first and second of the unit cell transistors differ by at least 0.1 volts and/or threshold voltages of first and second segments of a third of the unit cell transistors differ by at least 0.1 volts.

20 Claims, 22 Drawing Sheets

Related U.S. Application Data continuation-in-part of application No. 15/628,932, filed on Jun. 21, 2017, now Pat. No. 10,615,273.

(51) Int. Cl.

| | |
|---|---|
| *H01L 27/085* | (2006.01) |
| *H01L 29/06* | (2006.01) |
| *H01L 29/423* | (2006.01) |
| *H01L 29/778* | (2006.01) |
| *H03F 3/193* | (2006.01) |
| *H03F 3/195* | (2006.01) |
| *H03F 3/21* | (2006.01) |
| *H03F 3/42* | (2006.01) |
| *H01L 29/20* | (2006.01) |

(52) U.S. Cl.
CPC .... *H01L 29/42316* (2013.01); *H01L 29/7786* (2013.01); *H03F 3/193* (2013.01); *H03F 3/195* (2013.01); *H03F 3/21* (2013.01); *H03F 3/211* (2013.01); *H03F 3/423* (2013.01); *H01L 29/2003* (2013.01); *H03F 2200/366* (2013.01)

(56) References Cited

U.S. PATENT DOCUMENTS

| | | | |
|---|---|---|---|
| 6,818,951 B2 | 11/2004 | Moller et al. | |
| 7,288,803 B2 | 10/2007 | Beach et al. | |
| 7,388,777 B2* | 6/2008 | Shiba | H10B 69/00 365/185.26 |
| 7,696,828 B2 | 4/2010 | Chang | |
| 7,853,235 B2 | 12/2010 | Aparin | |
| 9,048,838 B2 | 6/2015 | Otremba et al. | |
| 9,620,424 B2 | 4/2017 | Blin et al. | |
| 9,780,746 B1* | 10/2017 | Fujii | H03F 3/195 |
| 10,038,064 B2 | 7/2018 | Tanaka | |
| 10,103,239 B1 | 10/2018 | Chou et al. | |
| 10,268,789 B1 | 4/2019 | Flowers et al. | |
| 10,637,472 B1* | 4/2020 | Mitra | H03K 19/018528 |
| 2002/0011893 A1* | 1/2002 | Takai | G05F 3/205 327/534 |
| 2004/0032701 A1* | 2/2004 | Yoshida | H03K 17/0822 361/93.1 |
| 2005/0127365 A1* | 6/2005 | Koyama | H01L 29/66757 257/E27.111 |
| 2006/0081985 A1 | 4/2006 | Beach et al. | |
| 2006/0170457 A1* | 8/2006 | Vijayakumaran Nair | H03K 17/0822 326/84 |
| 2006/0231905 A1* | 10/2006 | Roedle | H01L 29/4983 257/E29.12 |
| 2006/0249752 A1* | 11/2006 | Asano | H01L 29/812 257/E29.189 |
| 2007/0287404 A1 | 12/2007 | Arnborg | |
| 2008/0157222 A1 | 7/2008 | Wang | |
| 2009/0021231 A1* | 1/2009 | Imura | G05F 1/565 323/282 |
| 2010/0244043 A1 | 9/2010 | Hilt et al. | |
| 2011/0215420 A1 | 9/2011 | Hsueh et al. | |
| 2012/0001230 A1 | 1/2012 | Shinichiro | |
| 2012/0217542 A1* | 8/2012 | Morita | H01L 27/0605 257/140 |
| 2012/0228632 A1 | 9/2012 | Takada et al. | |
| 2013/0062625 A1 | 3/2013 | Yoshiharu | |
| 2015/0129965 A1 | 5/2015 | Roy et al. | |
| 2015/0171108 A1 | 6/2015 | Blin et al. | |
| 2015/0255547 A1 | 9/2015 | Yuan et al. | |
| 2016/0133739 A1* | 5/2016 | Kanaga | H01L 29/66522 257/194 |
| 2016/0181364 A1 | 6/2016 | Stewart et al. | |
| 2016/0373106 A1 | 12/2016 | Shah et al. | |
| 2017/0018639 A1 | 1/2017 | Teo et al. | |
| 2018/0033631 A1 | 2/2018 | Bera et al. | |
| 2018/0197999 A1 | 7/2018 | Palacios et al. | |
| 2019/0341480 A1 | 11/2019 | Boles et al. | |

FOREIGN PATENT DOCUMENTS

| | | |
|---|---|---|
| JP | H11283994 A | 10/1999 |
| JP | 2010539691 A | 12/2010 |

OTHER PUBLICATIONS

"Notification Concerning Transmittal of International Preliminary Report on Patentability, for corresponding International Application No. PCT/US2018/037760, mailing date Jan. 2, 2020, 10 pgs".

"Notification of Transmittal of the International Search Report and the Written Opinion of the International Searching Authority, or the Declaration, corresponding to International Application No. PCT/US2019/061371, date of mailing Feb. 3, 2020".

"Notification of Transmittal of the International Search Report and the Written Opinion of the International Searching Authority, or the Declaration, for corresponding International Application No. PCT/US2018/037760, mailing date: Oct. 8, 2018, 16 pages".

"Translation of Japanese Office Action, for corresponding Japanese Application No. 2019-571-38, mailed: Dec. 25, 2020".

Bonkee Kim , et al., ""A New Linearization Technique for MOSFET RF Amplifier Using Multiple Gated Transistors," IEEE Microwav and Guided Wave Letters, IEEE Inc., New York US, vol. 10, No. 9, Sep. 1, 2000".

Christian Fager, , et al., "Prediction of IMD in LDMOS Transistor Amplifiers Using a New Large-Signal Model, IEEE Transactions on Microwave Theory and Techniques, vol. 50, No. 12, Dec. 2002".

Kazutaka Inoue , et al., ""Linearity Improvement of GaN HEMT for Wireless Communication Applications," SEI Technical Review, No. 78, Apr. 2014".

* cited by examiner

SEMICONDUCTOR DEVICES HAVING UNIT CELL TRANSISTORS WITH SMOOTHED TURN-ON BEHAVIOR AND IMPROVED LINEARITY

CROSS-REFERENCE TO RELATED APPLICATION

The present application claims priority under 35 U.S.C. § 120 as a divisional application of U.S. patent Ser. No. 16/194,760, filed Nov. 19, 2018, which, in turn, claims priority as a continuation-in-part of U.S. patent application Ser. No. 15/628,932, filed Jun. 21, 2017, the entire content of which is incorporated herein by reference.

FIELD

The present invention described herein relates to microelectronic devices and more particularly to high power field effect transistors having unit cell-based structures.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for semiconductor devices which are capable of reliably operating at radio and microwave frequencies while still being capable of handling high power loads.

To provide increased output power, semiconductor devices have been developed that include a plurality of "unit cell" transistors that are formed on a common semiconductor structure and that are electrically connected in parallel. Each unit cell transistor may include a gate finger that extends in parallel between elongated source and drain contacts, as is schematically illustrated in FIG. 1.

In particular, FIG. 1 illustrates a metal layout of a conventional semiconductor device 10 that includes a gate pad 12, a source pad 22 and a drain pad 32 on a semiconductor structure 20. FIG. 1 is a plan view of the semiconductor device (i.e., looking down at the device from above) that illustrates various metal contact structures of the semiconductor device 10 that are formed on the underlying semiconductor structure 20. As shown in FIG. 1, in the conventional semiconductor device 10, the gate pad 12 is connected by a gate bus 14 to a plurality of gate fingers 16 that extend in parallel in a first direction (e.g., the y-direction indicated in FIG. 1). The drain pad 32 is connected to a plurality of drain contacts 36 via a drain bus 34. The source pad 22 is connected to a plurality of parallel source contacts 26 via a source bus 24 that is disposed at a different metallization layer (here a higher metallization layer that runs above the gate fingers 16 and the drain contacts 36). Vertically-extending (i.e., extending in a z-direction that is perpendicular to the x-direction and the y-direction) source contact plugs 28 electrically connect each source contact 26 to the source bus 24.

Each gate finger 16 runs along the y-direction between a pair of adjacent source and drain contacts 26, 36. A unit cell transistor of semiconductor device 10 is illustrated at box 40, and includes a gate finger 16 that extends between adjacent source and drain contacts 26, 36. The "gate length" refers to the distance of the gate metallization in the x-direction, while the "gate width" is the distance by which the gate fingers 16 and the source and drain contacts 26, 36 overlap in the y-direction. That is, "width" of a gate finger 16 refers to the dimension of the gate finger 16 that extends in parallel to the adjacent source/drain contacts 26, 36 (the distance along the y-direction). The power handling capability of the semiconductor device 10 may be proportional to its "gate periphery." The gate periphery of semiconductor device 10 is the sum of the gate widths for each gate finger 16 of the semiconductor device 10.

Semiconductor devices formed of wide band-gap semiconductor materials such as silicon carbide and/or gallium nitride based semiconductor materials may operate at higher current densities and hence are widely used in high power applications. In particular, gallium nitride based transistors that include one or more epitaxial layers of gallium nitride based semiconductor materials such as GaN, AlGaN, InGaN, etc. are now commonly used in high power applications such as transistor RF power amplifiers for wireless communications. The gallium nitride based epitaxial layers included in these devices are typically grown on silicon carbide or sapphire substrates. There is a need, however, for high power semiconductor devices that exhibit improved performance.

SUMMARY

Pursuant to embodiments of the present invention, semiconductor devices are provided that include a plurality of unit cell transistors that are formed on a common semiconductor structure. The unit cell transistors are electrically connected in parallel, and each unit cell transistor includes a gate finger. In some embodiments, the respective threshold voltages of first and second of the unit cell transistors differ by at least 0.1 volts and/or threshold voltages of first and second portions of a third of the unit cell transistors differ by at least 0.1 volts.

In some embodiments, the gate fingers may extend in parallel to one another. The semiconductor structure includes a gallium nitride based channel layer.

In some embodiments, the threshold voltage of the first and second of the unit cell transistors may differ by at least 0.25 volts. In some embodiments, the threshold voltages of the first and second segments of the third of the unit cell transistors may differ by at least 0.25 volts or by at least 0.5 volts. In some embodiments, the threshold voltage of the first and second of the unit cell transistors may differ by between 0.1-1.25 volts. In some embodiments, the threshold voltages of the first and second portions of the third of the unit cell transistors may differ by between 0.1-1.25 volts.

In some embodiments, the unit cell transistors may be divided into a plurality of groups, each group including at least five unit cell transistors, where the threshold voltages of the unit cell transistors within each group are within 0.01 volts of each other. Each group may include approximately the same number of unit cell transistors. The number of groups may be two or three in example embodiments.

In some embodiments, each gate finger may include at least two segments having threshold voltages that differ by at least 0.1 volts. In other embodiments, each gate finger may include at least two segments having threshold voltages that differ by at least 0.25 volts or by at least 0.5 volts. In still other embodiments, each gate finger may include at least two segments having threshold voltages that differ by between 0.1-1.25 volts.

In some embodiments, the semiconductor structure may include a gallium nitride based layer that acts as a barrier layer for each of the unit cell transistors, and a thickness of the gallium nitride based layer may vary in different regions of the semiconductor device. For example, in some embodiments, the gallium nitride based layer may have a first thickness underneath the first segment of the third of the unit cell transistors and may have a second, different thickness underneath the second segment of the third of the unit cell transistors. In other embodiments, the gallium nitride based layer may have a first thickness underneath the first of the unit cell transistors and may have a second thickness underneath the second of the unit cell transistors.

In some embodiments, a doping concentration of the portion of the channel layer that is underneath a gate finger of the third of the unit cell transistors may vary along the width of the gate finger of the third of the unit cell transistors.

In some embodiments, a first doping concentration of a first portion of the channel layer that is underneath a gate finger of the first of the unit cell transistors fingers may be different than a second doping concentration of a second portion of the channel layer that is underneath a gate finger of the second of the unit cell transistors. For example, one may be doped and the other may be undoped.

In some embodiments, at least a portion of a gate finger of the first of the unit cell transistors may be a different material than at least a portion of a gate finger of a second of the unit cell transistors.

Pursuant to further embodiments of the present invention, semiconductor devices are provided that include a plurality of unit cell transistors that are formed on a semiconductor structure. The unit cell transistors are electrically connected in parallel, and each unit cell transistor including a gate finger. Threshold voltages of at least a first subset of the unit cell transistors vary along the width of the respective gate fingers of the unit cell transistors in the first subset of the unit cell transistors.

In some embodiments, the threshold voltages of the unit cell transistors in the first subset of the unit cell transistors may vary by at least 0.1 volts along the width of their respective gate fingers. In other embodiments, the threshold voltages of the unit cell transistors in the first subset of the unit cell transistors may vary by at least 0.25 volts (or by at least 0.5 volts) along the width of their respective gate fingers. In still other embodiments, the threshold voltages of the unit cell transistors in the first subset of the unit cell transistors may vary by between 0.1-1.25 volts along the width of their respective gate fingers.

In some embodiments, the gate fingers of the unit cell transistors may extend in parallel to one another.

In some embodiments, the semiconductor structure may include a gallium nitride based channel layer.

In some embodiments, each gate finger may include at least three segments that have different threshold voltages.

In some embodiments, the semiconductor device may include a gallium nitride based layer that acts as a barrier layer for each of the unit cell transistors. The gallium nitride based layer may have at least two different thicknesses underneath at least half of the gate fingers.

In some embodiments, the semiconductor device may include a channel layer, and respective portions of the channel layer that are underneath the gate fingers may have different doping concentrations underneath at least two different portions of each of the respective gate fingers.

In some embodiments, each gate finger of the first subset of the unit cell transistors may have between two and five segments. A value of the threshold voltage of each unit cell transistor in the first subset of the unit cell transistors may be substantially constant along each segment, while different segments may have threshold voltages that vary by at least 0.1 volts from at least one other segment.

Pursuant to still further embodiments of the present invention, semiconductor devices are provided that include a plurality of unit cell transistors that are formed on a semiconductor structure. The unit cell transistors are electrically connected in parallel, and each unit cell transistor including a gate finger. Each unit cell transistor in a first subset of the unit cell transistors may have a first threshold voltage and each unit cell transistor in a second subset of the unit cell transistors may have a second threshold voltage that differs from the first threshold voltage.

In some embodiments, the first threshold voltage may differ from the second threshold voltage by at least 0.1 volts.

In some embodiments, the gate fingers may extend in parallel to one another.

In some embodiments, the semiconductor structure may include a gallium nitride based channel layer.

In some embodiments, the first threshold voltage may differ from the second threshold voltage by at least 0.25 volts or by at least 0.5 volts. In some embodiments, the first threshold voltage may differ from the second threshold voltage by between 0.1-1.25 volts.

In some embodiments, the first subset of the unit cell transistors and the second subset of the unit cell transistors may each include approximately the same number of unit cell transistors.

In some embodiments, each unit cell transistor in a third subset of the unit cell transistors may have a third threshold voltage that differs from both the first threshold voltage and the second threshold voltage.

In some embodiments, the semiconductor structure may include a gallium nitride based layer that acts as a barrier layer of each of the unit cell transistors. A thickness of the gallium nitride based layer under the gate fingers of each unit cell transistor in the first subset of the unit cell transistors may be different than a thickness of the barrier layer under the gate fingers in each unit cell transistor in the second subset of the unit cell transistors.

In some embodiments, the semiconductor device may include a channel layer, and a first doping concentration of a first portion of the channel layer that is underneath the gate fingers of the unit cell transistors in the first subset of the unit cell transistors may be different from a second doping concentration of a second portion of the channel layer that is underneath the gate fingers of the unit cell transistors in the second subset of the unit cell transistors.

Pursuant to still further embodiments of the present invention, a method of increasing the linearity of a semiconductor device is provided in which a semiconductor device is formed that includes a plurality of unit cell transistors on a common semiconductor structure, the unit cell transistors electrically connected in parallel, and each unit cell transistor including a gate finger. One or more voltage signals are applied to the gate fingers of the unit cell transistors in order to turn on different portions of the 2DEG channel of the semiconductor device at respective different levels of current flow.

In some embodiments, first and second segments of at least some of the gate fingers may have threshold voltages that differ by at least 0.1 volts. In other embodiments, these first and second segments may have threshold voltages that differ by at least 0.25 volts.

In some embodiments, different ones of the unit cell transistors may have threshold voltages that differ by at least 0.1 volts. In other embodiments, different ones of the unit cell transistors may have threshold voltages that differ by at least 0.25 volts or by at least 0.5 volts. In still other embodiments, different ones of the unit cell transistors may have threshold voltages that differ by between 0.1-1.25 volts.

In some embodiments, each unit cell transistor has substantially the same threshold voltage and the same structure. In these embodiments, a first of the voltage signals may be applied to a first subset of the gate fingers of the unit cell transistors and a second of the voltage signals that differs from the first voltage signal by at least 0.1 volts may be simultaneously applied to a second subset of the gate fingers of the unit cell transistors. In other embodiments, the first and second of the voltage signals may differ by at least 0.25 volts or be between 0.1-1.25 volts.

In some embodiments, the unit cell transistors may be divided into a plurality of groups, each group including at least five unit cell transistors. The threshold voltages of the unit cell transistors within each group may be within 0.01 volts of each other in some embodiments. Each group may include approximately the same number of unit cell transistors in some embodiments, and the number of groups may be two, three or more in various embodiments.

In some embodiments, the semiconductor structure may include a gallium nitride based channel layer and a gallium nitride based barrier layer on the gallium nitride based channel layer, and the gate fingers may extend in parallel to one another. In such embodiments, a thickness of the gallium nitride based barrier layer may vary in different regions of the semiconductor device. The gallium nitride based barrier layer may, for example, have a first thickness underneath a first segment of a first of the unit cell transistors and a second, different thickness underneath a second segment of the first of the unit cell transistors. Additionally or alternatively, the gallium nitride based layer may have a first thickness underneath a first subset of the unit cell transistors and a second thickness underneath a second subset of the unit cell transistors.

Pursuant to still further embodiments of the present invention, semiconductor devices are provided that include a plurality of unit cell transistors on a semiconductor structure. The unit cell transistors are electrically connected in parallel, and each unit cell transistor including a gate finger that extends above a gallium nitride based barrier layer of the semiconductor structure. A thickness of the gallium nitride based barrier layer is different in different locations within the semiconductor device.

In some embodiments, the gallium nitride based barrier layer may have a first thickness underneath respective first segments of the gate fingers of a first subset of the unit cell transistors and a second, different thickness underneath respective second segments of the gate fingers of the first subset of the unit cell transistors. The first and second thicknesses may differ, for example, by at least 1 nm.

In some embodiments, the gallium nitride based barrier layer may have a first thickness underneath a first subset of the unit cell transistors and a second thickness underneath a second subset of the unit cell transistors. The first and second thicknesses may differ, for example, by at least 1 nm.

In some embodiments, different subsets of the unit cell transistors may have threshold voltages that differ by at least 0.1 volts or by at least 0.25 volts or by at least 0.5 volts.

In some embodiments, different segments of at least one of the gate fingers may have threshold voltages that differ by at least 0.1 volts or by at least 0.25 volts or by at least 0.5 volts.

Pursuant to still further embodiments of the present invention, semiconductor devices are provided that include a plurality of unit cell transistors on a semiconductor structure that includes a gallium nitride based barrier layer. The unit cell transistors are electrically connected in parallel, and each unit cell transistor including a gate finger that extends above the gallium nitride based barrier layer. These devices further include a voltage divider that has a first output that is coupled to the gate fingers of a first subset of the unit cell transistors and a second output that is coupled to the gate fingers of a second subset of the unit cell transistors. The first and second outputs are configured to apply respective first and second voltages to the gate fingers of the respective first and second subsets of the unit cell transistors, where the first and second voltages differ by at least 0.1 volts.

In some embodiments, the unit cell transistors of the first and second subsets of unit cell transistors may have identical designs.

In some embodiments, the first and second voltages may differ by at least 0.25 volts.

In some embodiments, the voltage divider may include a third output that is coupled to the gate fingers of a third subset of the unit cell transistors, where the third output is configured to apply a third voltage to the gate fingers of the third subset of the unit cell transistors, the third voltage differing from both the first and second voltages by at least 0.1 volts (or by at least 0.25 volts or 0.5 volts in other embodiments).

Pursuant to additional embodiments of the present invention, RF power amplifiers are provided that include a plurality of unit cell transistors on a common wide bandgap semiconductor structure. The unit cell transistors are electrically connected in parallel, and each unit cell transistor includes a respective gate finger. The unit cell transistors are configured so that a third order transconductance response of the RF power amplifier includes at least three peaks. The peaks may comprise, for example, at least two positive peaks and a least one negative peak or at least one positive peak and at least two negative peaks. In some embodiments, the third order transconductance response of the RF power amplifier includes at least two positive peaks and the at least two negative peaks. These peaks may all be at gate-to-source voltage values that are within a turn-on region for the gate-to-source voltage. The positive peaks in the third order transconductance response that are associated with higher threshold voltage values may be larger than the respective positive peaks in the third order transconductance response that are associated with lower threshold voltage values in some embodiments. The negative peaks in the third order transconductance response that are associated with higher threshold voltage values may be larger (i.e., more negative) than the respective negative peaks in the third order transconductance response that are associated with lower threshold voltage values in some embodiments.

In some embodiments, a first portion of the RF power amplifier may have a first threshold voltage and a second portion of the RF power amplifier may have a second threshold voltage, where the first and second threshold voltages differ by at least 0.25 volts. In other embodiments, the difference in the first and second threshold voltages may be at least 0.5 volts, at least 0.75 volts, or at least 1.0 volts In some embodiments, the first portion may comprise a first percentage of a gate periphery of the RF power amplifier and the second portion may comprise a second percentage of the gate periphery of the RF power amplifier, and the second percentage may exceed the first percentage by at least five percentage points. For example, in one specific embodiment, the first percentage may be no more than 45% of the gate periphery and the second percentage may be at least 55% of the gate periphery. In some embodiments, the first threshold voltage may be less than the second threshold voltage.

In some embodiments, the RF power amplifier may be a gallium nitride based high electron mobility transistor ("HEMT") RF power amplifier. The HEMT RF power amplifier may include a gallium nitride based channel layer and a gallium nitride based barrier layer on the channel layer, the barrier layer having a higher band-gap than the channel layer. The channel layer and the barrier layer may be part of the common wide bandgap semiconductor structure. In some embodiments, the thickness of the gallium nitride based barrier layer may differ underneath different portions of the gate fingers. For example, a first portion of the gate periphery may be on top of portions of the barrier layer that have a first thickness and a second portion of the gate periphery may be on top of portions of the barrier layer that have a second thickness, where the first and second thicknesses differ by at least 5 nanometers. In other embodiments, the first and second thicknesses may differ by at least 7.5 nanometers or by at least 10 nanometers.

In some embodiments, a threshold voltage of a first segment of a first of the gate fingers may exceed a threshold voltage of a second segment of the first of the gate fingers by at least 0.25 volts.

Pursuant to further embodiments of the present invention, RF power amplifiers are provided that include a plurality of unit cell transistors on a common wide bandgap semiconductor structure. The unit cell transistors are electrically connected in parallel, and each unit cell transistor includes a respective gate finger. A gate periphery of the RF power amplifier includes a first portion and a second portion, and the first portion has a first threshold voltage and the second portion has a second threshold voltage that differs from the first threshold voltage by at least 0.1 volts. The first portion comprises a first percentage of the gate periphery and the second portion comprises a second percentage of the gate periphery that exceeds the first percentage by at least five (5) percentage points.

In some embodiments, the first and second threshold voltages may differ by at least 0.25 volts, at least 0.5 volts, at least 0.75 volts or by at least 1.0 volts.

In some embodiments, the first percentage may be no more than 45% of the gate periphery and the second percentage may be at least 55% of the gate periphery.

In some embodiments, the first threshold voltage may be less than the second threshold voltage.

In some embodiments, the RF power amplifier may be a gallium nitride based RF power amplifier. For example, in some embodiments, the RF power amplifier may be a gallium nitride based high electron mobility transistor RF power amplifier having a gallium nitride based channel layer and a gallium nitride based barrier layer. The gallium nitride based barrier layer may have a first thickness underneath a first portion of the gate periphery and a second thickness underneath a second portion of the gate periphery, where the first and second thicknesses differ by at least 5 nanometers.

In some embodiments, a gate periphery of the RF power amplifier may further include a third portion that has a third threshold voltage that differs from both the first threshold voltage and the second threshold voltage by at least 0.1 volts, at least 0.5 volts, at least 0.75 volts or by at least 1.0 volts.

Pursuant to yet additional embodiments of the present invention, gallium nitride based RF power amplifiers are provided that may exhibit a significant reduction in soft compression behavior as compared to conventional gallium nitride based RF power amplifiers. These RF power amplifiers may include a plurality of unit cell gallium nitride based high electron mobility transistors that are on a common semiconductor structure and that are electrically connected in parallel, and each unit cell gallium nitride based high electron mobility transistor including a respective gate finger. The unit cell gallium nitride based high electron mobility transistors are configured so that the RF power amplifier exhibits gain compression of less than 0.5 dB for RF signals having input power levels of between 20 dB and 11 dB back-off from the saturation power (i.e., the input power level corresponding to the maximum output power level) and gain compression of less than 1.0 dB for RF signals having input power levels of between 11 dB and 6 dB back-off from the saturation power, when the RF power amplifier is operated at a drain to source current level of greater than 50 mA/mm.

Pursuant to still further embodiments of the present invention, methods of improving the linearity of an RF power amplifier are provided. The RF power amplifier may include a plurality of unit cell transistors that are electrically connected in parallel on a common wide bandgap semiconductor structure. Pursuant to these methods, a common gate signal having an increasing voltage level is applied to the respective gate fingers of the unit cell transistors so as to increase the gate-to-source capacitance of the RF power amplifier to a first level. Then, the voltage level of the common gate signal that is applied to the respective gate fingers of the unit cell transistors is further increased while maintaining the gate-to-source capacitance of the RF power amplifier substantially at the first level. Then, the voltage level of the common gate signal that is applied to the respective gate fingers of the unit cell transistors is increased even further so as to increase the gate-to-source capacitance of the RF power amplifier to a second level that is at least 1.5 times larger than the first level.

In some embodiments, a first portion of a gate periphery of the RF power amplifier may have a first threshold voltage and a second portion of the gate periphery of the RF power amplifier may have a second threshold voltage, the first and second threshold voltages differing by at least 0.25 volts.

In some embodiments, the first portion may be a first percentage of the gate periphery and the second portion may be a second percentage of the gate periphery, and the second percentage may exceed the first percentage by at least five percentage points. For example, the first percentage may be no more than 45% of the gate periphery and the second percentage may be at least 55% of the gate periphery in one specific embodiment. In some embodiments, the first threshold voltage may be less than the second threshold voltage.

In some embodiments, the RF power amplifier may be a gallium nitride based high electron mobility transistor RF power amplifier.

In some embodiments, the gate fingers may be on a top surface of a gallium nitride based barrier layer that has a first thickness underneath a first portion of the gate periphery and a second thickness underneath a second portion of the gate periphery, where the first and second thicknesses differ by at least 5 nanometers.

In some embodiments, a threshold voltage of a first segment of a first of the gate fingers may exceed a threshold voltage of a second segment of the first of the gate fingers by at least 0.25 volts.

DETAILED DESCRIPTION

Figure 1:
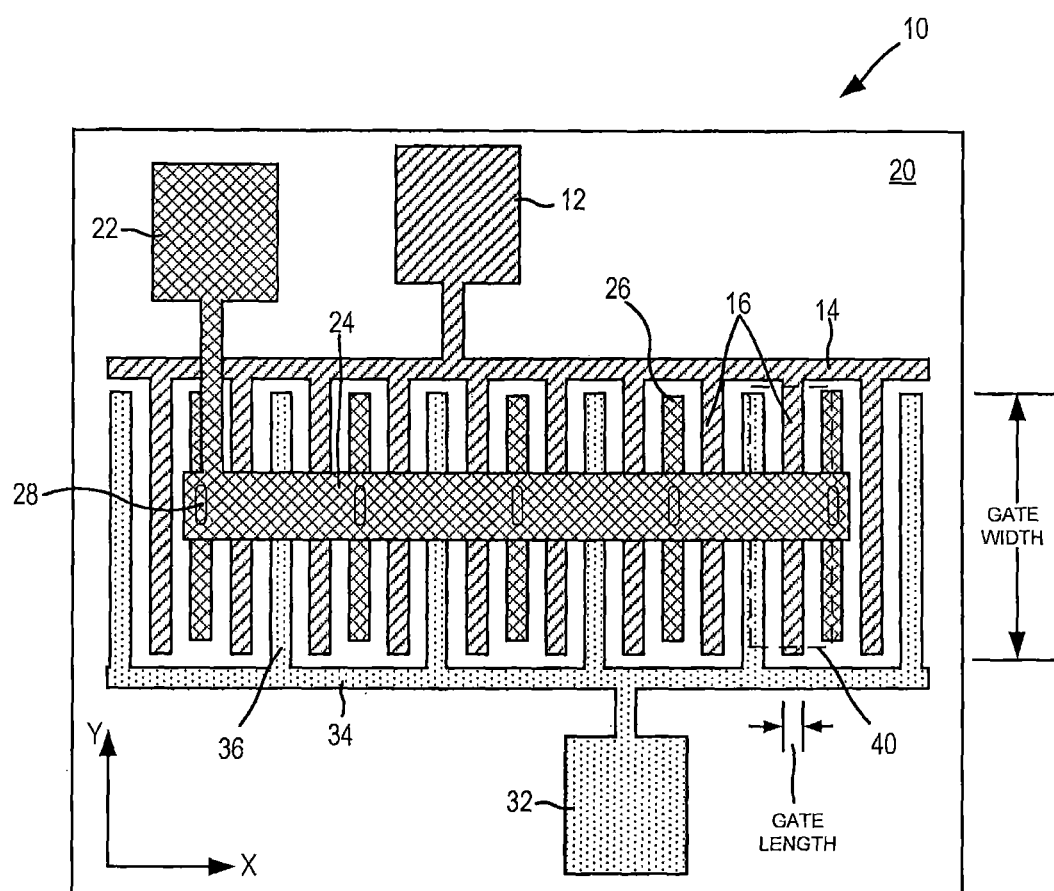
FIG. 1 is a plan view of a metal layout of a conventional multi-cell semiconductor device.

Embodiments of the present invention provide multi-cell semiconductor devices (i.e., a semiconductor device that includes a plurality of unit cell transistors) that may exhibit improved linearity. One common measure of the linearity of a multi-cell semiconductor device is the third order transconductance behavior of the device. Because multi-cell semiconductor devices formed in gallium nitride and various other wide bandgap semiconductor material systems may exhibit sharp turn-on behavior, multi-cell semiconductor devices formed in these material systems may exhibit significant variance in their third order transconductance response at device turn-on. Non-linearities in the third order transconductance may generate third order intermodulation products in the output signal of the transistor. If these third order intermodulation products fall within a channel of a communications system that includes the multi-cell semiconductor device, the third order intermodulation products may degrade the performance of the communications system. The third order transconductance at device turn-on is often the primary parameter contributing to third order intermodulation products in a multi-cell semiconductor device. The peak third order transconductance value increases proportionally with the size of the device. Thus, as applications require larger, higher power semiconductor devices, it may become increasingly difficult to provide a high degree of linearity.

Pursuant to embodiments of the present invention, multi-cell semiconductor devices are provided that may exhibit significantly improved linearity. This improved linearity may be achieved by engineering the threshold voltage of the device to provide the improved linearity, or by applying different gate voltages to different portions of the device.

The semiconductor devices according to embodiments of the present invention may, in some embodiments, be high power devices that include a plurality of unit cells that are electrically connected in parallel. Each unit cell may include a gate finger, and the gate fingers may extend in parallel to each other. The multi-cell semiconductor devices may be gallium nitride based devices in some embodiments. For example, the devices may be gallium nitride based HEMT RF power amplifiers.

The threshold voltage of a field effect transistor refers to the minimum gate-to-source voltage differential that is needed to allow current to pass between the source and drain terminals of the transistor. The multi-cell semiconductor devices according to embodiments of the present invention may have a variable threshold voltage that is different in different locations within the device. In some embodiments, distinct subsets of the gate fingers may have different threshold voltages. In other embodiments, the threshold voltage may vary along the widths of the respective gate fingers. In still other embodiments, the above two approaches can be combined. By designing the semiconductor devices to have different threshold voltages in different regions of the device, different portions of the 2DEG channel of the semiconductor device may turn on at different degrees in response to application of a gate voltage. In other words, different portions of the 2DEG channel of the semiconductor device may turn on at different levels of current flow. For example, in some embodiments, different portions of the 2DEG channel of the semiconductor device may have levels of current flow that differ by at least 5%. In other embodiments, different portions of the 2DEG channel of the semiconductor device may have levels of current flow that differ by at least 10%. In still other embodiments, different portions of the 2DEG channel of the semiconductor device may have levels of current flow that differ by between 10%-30%. As discussed above, semiconductor devices formed in wide band-gap semiconductor material systems such as, for example, gallium nitride based semiconductors, may exhibit fast turn-on behavior where all of the unit cells turn on essentially simultaneously. Since the third order transconductance tends to peak at turn-on, multi-cell semiconductor devices formed in such material systems may experience a large spike in the third order transconductance at device turn-on, since all of the unit cells turn on simultaneously. By varying the threshold voltage so that different portions of the device have different threshold voltages, the degree to which the channel is turned on at any given time will vary across the device, reducing the magnitude of the spike in the third order transconductance.

In some embodiments, the semiconductor devices may be high electron mobility transistors ("HEMT") that include a channel layer and a barrier layer. In such devices, the threshold voltage may be varied in different regions of the device by varying the thickness of the barrier layer. In other embodiments, the doping concentration of the barrier layer and/or the channel layer may be varied in different portions of the device to vary the threshold voltage. In still other embodiments, the composition of the gate fingers may be varied, either along the width of the gate finger and/or between different gate fingers. For example, different metals may be used and/or metal alloys having different compositions in order to vary the threshold voltage.

In still other embodiments, multi-cell semiconductor devices are provided that may include an associated voltage divider circuit that may be configured to provide different gate voltages to different unit cells of the device. These devices may have unit cells that have the same structure and configuration. However, by applying different gate voltages to different subsets of the gate fingers, different unit cell transistors can be configured to turn on at different degrees (i.e., at different levels of current flow) in order to smooth out the peak in the third order transconductance.

The semiconductor devices according to embodiments of the present invention may exhibit significantly improved linearity. For example, if the semiconductor device is divided into two regions having different threshold voltage values, the peak third order transconductance value may be reduced on the order of 30% as compared to a device having uniform threshold voltages throughout. If the semiconductor device is divided into three regions having different threshold voltage values, the peak third order transconductance value may be reduced on the order of 65% as compared to a device having uniform threshold voltages throughout. In semiconductor devices having greater variation in the threshold voltage (e.g., four or more different threshold voltage levels), further reduction of the third order transconductance may be achieved. These improvements in linearity may be achieved with little impact on the other operating characteristics of the device such as, for example, the gain of the device.

In some example embodiments, semiconductor devices are provided that include a plurality of unit cell transistors that are formed on a common wide bandgap semiconductor structure. The unit cell transistors are electrically connected in parallel, and each unit cell transistor includes a respective gate finger. The threshold voltages of first and second subsets of the unit cell transistors are designed to differ by, for example, at least 0.1 volts in some embodiments. In other embodiments, this difference may be at least 0.25 volts. In further embodiments, this difference may be at least 0.5 volts. In still other embodiments, the difference may be between 0.1-1.25 volts.

In other example embodiments, semiconductor devices are provided that include a plurality of unit cell transistors that are formed on a common wide bandgap semiconductor structure. The unit cell transistors are electrically connected in parallel, and each unit cell transistor includes a respective gate finger. The threshold voltages of first and second segments of at least some of the unit cell transistors are designed to differ by, for example, at least 0.1 volts in some embodiments. In other embodiments, this difference may be at least 0.25 volts or at least 0.5 volts. In still other embodiments, the difference may be between 0.1-1.25 volts.

In still further example embodiments, semiconductor devices are provided that include a plurality of unit cell transistors on a common wide bandgap semiconductor structure. The unit cell transistors are electrically connected in parallel, and each unit cell transistor includes a gate finger that extends above a gallium nitride based barrier layer of the semiconductor structure. A thickness of the gallium nitride based barrier layer is different in different locations within the semiconductor device in order to vary the threshold voltage throughout the semiconductor device.

In yet additional example embodiments, semiconductor devices are provided that include a plurality of unit cell transistors on a semiconductor structure. The unit cell transistors are electrically connected in parallel, and each unit cell transistor includes a gate finger that extends above a gallium nitride based barrier layer of the semiconductor structure. The semiconductor devices include a voltage divider that has a first output that is coupled to the gate fingers of a first subset of the unit cell transistors and a second output that is coupled to the gate fingers of a second subset of the unit cell transistors. The first and second outputs are configured to apply first and second voltages to the gate fingers of the first and second subsets of the unit cell transistors, respectively, where the first and second voltages differ by, for example, at least 0.1 volts or by at least 0.25 volts in other embodiments.

Methods of increasing the linearity of a semiconductor device are also provided. Pursuant to these methods, a semiconductor device is formed that includes a plurality of unit cell transistors on a common semiconductor structure. The unit cell transistors are electrically connected in parallel, and each unit cell transistor includes a gate finger. One or more voltage signals are applied to the gate fingers of the unit cell transistors in order to turn on between two and ten different portions of the semiconductor device at respective different degrees.

In still other example embodiments, RF power amplifiers are provided that include a plurality of unit cell transistors on a common wide bandgap semiconductor structure such as a gallium nitride based semiconductor structure. The unit cell transistors are electrically connected in parallel, and each unit cell transistor includes a respective gate finger. The unit cell transistors are configured so that a third order transconductance response of the RF power amplifier includes at least three peaks. The at least three peaks may comprise, for example, at least two positive peaks and at least one two negative peak, at least one positive peak and at least two negative peaks, or at least two positive peaks and at least two negative peaks in example embodiments. Both the positive peaks and the negative peaks in the third order transconductance response may be less pronounced (i.e., lower positive peaks and less negative peaks) than the peaks in the third order transconductance response of a comparable conventional RF power amplifier. Moreover, the peaks in the third order transconductance in the RF power amplifiers according to embodiments of the present invention may be spread out over a wider range of gate-to-source voltages. Since the variation in the third order transconductance response is both reduced in magnitude and spread out over a larger range of gate-to-source voltage values, non-linearities in the gain response of the RF power amplifier may be reduced, and soft gain compression effects that are present in comparable conventional RF power amplifiers may be significantly reduced or even eliminated. As a result, the input power level required to reach point where 1 dB and/or 3 dB gain compression occurs may be pushed out to higher input power levels as compared to comparable conventional RF power amplifiers when the RF power amplifier is operated at higher bias current levels.

In yet still further embodiments, the percentage of the device that has a first threshold voltage may be different than the percentage of the device that has a second, different threshold voltage. For example, in some embodiments, the RF power amplifier may be configured so that a first percentage of the gate periphery has a first threshold voltage and a second percentage of the gate periphery has a different, second threshold voltage. The second percentage may exceed the first percentage by at least five percentage points in some embodiments, by at least 10 percentage points in other embodiments, by at least 15 percentage points in still further embodiments, and by at least 20 percentage points in yet additional embodiments. For example, in one embodiment, the first percentage may be between 35-45% of the gate periphery and the second percentage may be between 55-65% of the gate periphery. The first threshold voltage may be less than the second threshold voltage.

According to still further embodiments of the present invention, gallium nitride based RF power amplifiers are provided that include a plurality of unit cell gallium nitride based high electron mobility transistors on a common semiconductor structure that are configured so that the RF power amplifier exhibits gain compression of less than 0.5 dB for RF signals having input power levels of between 20 dB and 11 dB back-off from the saturation power and gain compression of less than 1.0 dB for RF signals having input power levels of between 11 dB and 6 dB back-off from the saturation power, when the RF power amplifier is operated at a drain to source current level of greater than 50 mA/mm.

Embodiments of the present invention will now be described in greater detail with reference to FIGS. 2-25.

Figure 2:
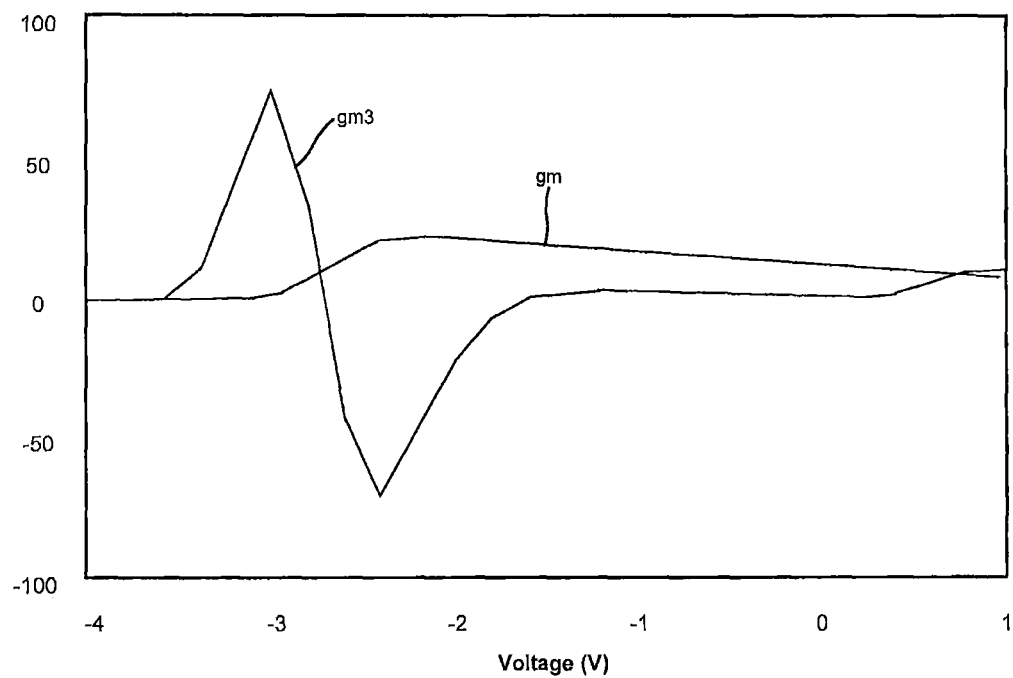
FIG. 2 is a graph illustrating the transconductance and the third order transconductance as a function of the applied threshold voltage for a conventional semiconductor device with unit gate fingers having widths of 125 microns.

FIG. 2 is a graph illustrating the transconductance (gm) and the third order transconductance (gm3) as a function of the gate-to-source voltage differential for a conventional gallium nitride based multi-cell semiconductor device, such as the semiconductor device 10 of FIG. 1. As shown in FIG. 2, the third order transconductance has a high positive peak followed by a high negative peak and then tends to smooth out as the applied gate voltage increases from device turn-on to saturation. Due to the sharp turn-on behavior of gallium nitride based transistors, an absolute value of the third order transconductance reaches a maximum value near pinch off, which refers to the drain to source voltage level after which the drain to source current becomes almost constant (i.e., where the transistor enters into the saturation region). As can be seen in FIG. 2, the third order transconductance peaks at a value of −70.2 mS/V. As noted above, non-linearities in the third order transconductance may generate third order intermodulation products in the output signal of the device that may degrade the performance of a communications system that includes the device. Consequently, allowable values for third order transconductance are often specified for applications such as various wireless communications applications, and the semiconductor devices suitable for operation in such systems must have peak third order transconductance values that are less than the specified values.

Figure 3:
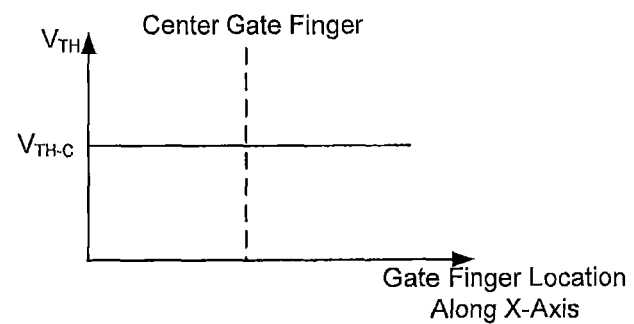
FIG. 3 is a schematic graph illustrating the threshold voltage variation in the conventional multi-cell semiconductor device of FIG. 1.

FIG. 3 is a graph illustrating the threshold voltage variation in a conventional multi-cell semiconductor device having the design of the semiconductor device 10 of FIG. 1.

Referring to FIG. 3, the vertical axis represents the threshold voltage (i.e., the gate-to-source voltage differential at which the unit cell transistors turn on), while the horizontal axis denotes the gate fingers included in the conventional semiconductor device 10, arranged in their order across the device (i.e., arranged in the x-axis direction of FIG. 1). In other words, the left portion of the horizontal axis of FIG. 3 corresponds to the gate fingers 16 on the left side of the semiconductor device 10 of FIG. 1 while the right portion of the horizontal axis of FIG. 3 corresponds to the gate fingers 16 on the right side of the semiconductor device 10 of FIG. 1. Thus, FIG. 3 shows the threshold voltage for each of the unit cell transistors of the semiconductor device 10. As shown in FIG. 3, in the conventional semiconductor device 10, all of the unit cell transistors 40 have the same threshold voltage value $V_{TH-C}$. It should also be noted that in the conventional semiconductor device 10, the threshold voltage value $V_{TH-C}$ is constant along the width of each gate finger 16.

Figure 4A:
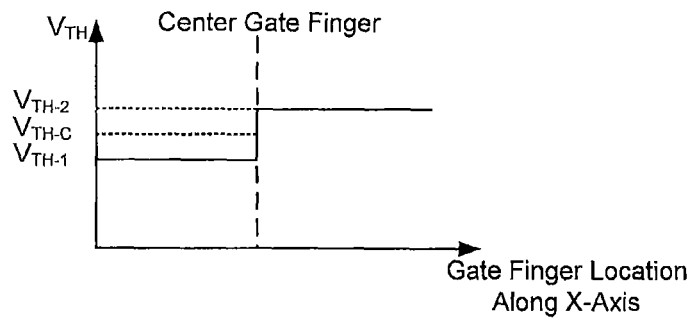
FIGS. 4A-4C are schematic graphs illustrating the threshold voltage variation in multi-cell semiconductor devices according to certain embodiments of the present invention.
Figure 4B:
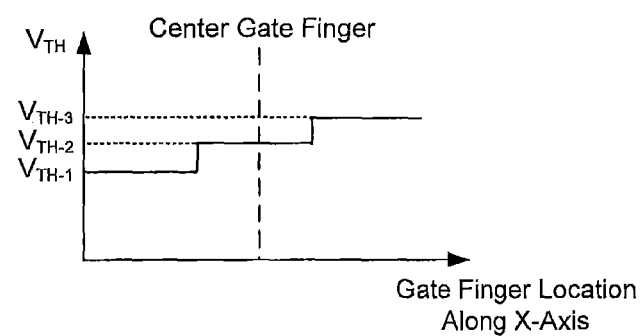
Figure 4C:
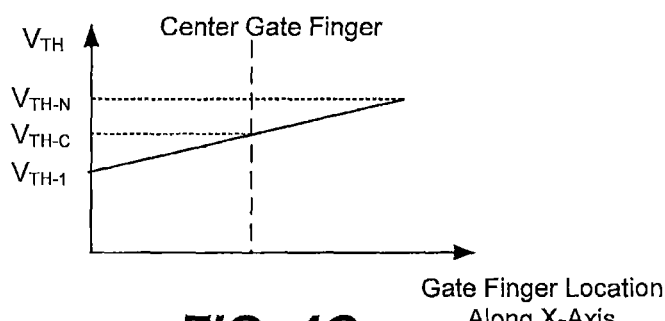

FIGS. 4A-4C are graphs illustrating the threshold voltage variation in multi-cell semiconductor devices according to certain embodiments of the present invention. As with FIG. 3, in FIGS. 4A-4C the horizontal axis denotes the locations of the gate fingers within the transistor along the direction of the x-axis of FIG. 1 (as well as the x-axis direction of FIGS. 5A-5C, which are discussed below), while the vertical axis represents the threshold voltage for the unit cell transistors corresponding to each respective gate finger.

As shown in FIG. 4A, in a first example embodiment, a first subset of the unit cell transistors are designed to have a first threshold voltage value $V_{TH-1}$ and a second subset of the unit cell transistors are designed to have a second threshold voltage value $V_{TH-2}$ that is greater than the first threshold voltage value $V_{TH-1}$. The first threshold voltage value $V_{TH-1}$ may, for example, be lower than $V_{TH-C}$ while the second threshold voltage value $V_{TH-2}$ may, for example, be higher than $V_{TH-C}$. In example embodiments, $V_{TH-2}$-$V_{TH-1}$ may be between 0.1 and 0.8 volts, although embodiments of the present invention are not limited thereto.

Referring next to FIG. 4B, in a second example embodiment, a first subset of the unit cell transistors are designed to have a first threshold voltage value $V_{TH-1}$, a second subset of the unit cell transistors are designed to have a second threshold voltage value $V_{TH-2}$ that is greater than the first second threshold voltage value $V_{TH-1}$, and a third subset of the unit cell transistors are designed to have a third threshold voltage value $V_{TH-3}$ that is greater than the second threshold voltage value $V_{TH-2}$. The first threshold voltage value $V_{TH-1}$ may, for example, be lower than $V_{TH-C}$, the second threshold voltage value $V_{TH-2}$ may, for example, be approximately equal to $V_{TH-C}$, and the third threshold voltage value $V_{TH-3}$ may, for example, be higher than $V_{TH-C}$. In example embodiments, $V_{TH-3}$-$V_{TH-1}$ may be between 0.1 and 0.8 volts, although embodiments of the present invention are not limited thereto. By adding a third discrete threshold voltage value $V_{TH-3}$, the peak value of the third order transconductance at device turn-on may be further reduced by spreading out (smoothing) the device turn-on over a larger range of applied gate voltages.

Referring next to FIG. 4C, in a third example embodiment, each unit cell transistor may have a different threshold voltage value. In particular, the semiconductor device corresponding to FIG. 4C has unit cell transistors having steadily increasing threshold voltage values. Thus, for a semiconductor device having N unit cell transistors, the threshold voltage values may range from $V_{TH-1}$ to $V_{TH-N}$. The threshold voltage value $V_{TH-N/2}$ of the center unit cell transistor may, for example, be approximately equal to $V_{TH-C}$. The design corresponding to FIG. 4C may further spread out when different portions of the device turn on in response to application of a turn-on voltage to a gate pad of the device. The design of the semiconductor device corresponding to FIG. 4C may further reduce the peak value of the third order transconductance at device turn-on.

While FIGS. 4A-4C illustrate that the threshold voltage increases (either continuously or in discrete groups) with increasing unit cell transistor (or equivalently, gate finger position) as you move from left to right across the device (or alternatively, from right to left), it will be appreciated that this need not be the case. For example, FIGS. 10A-10C (discussed in detail below) illustrate additional example embodiments in which the threshold voltages for different sets of unit cell transistors are more randomly distributed throughout the device.

Figure 5A:
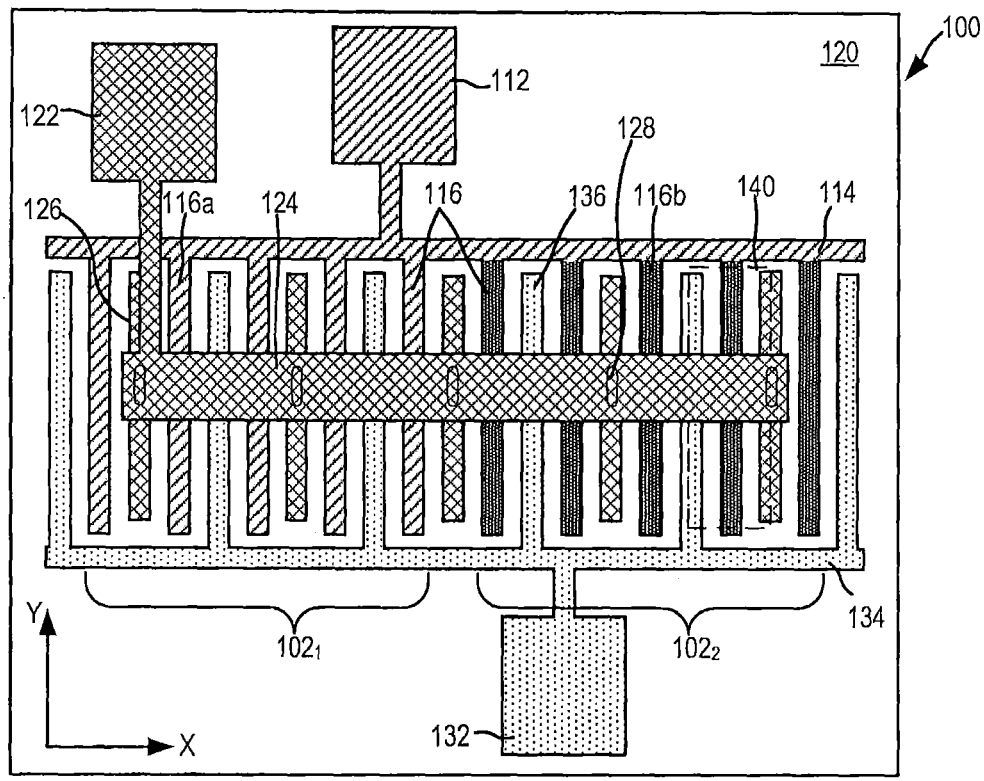
FIGS. 5A-5C are schematic plan views of multi-cell semiconductor devices according to embodiments of the present invention that have gate fingers having different threshold voltages.
Figure 5B:
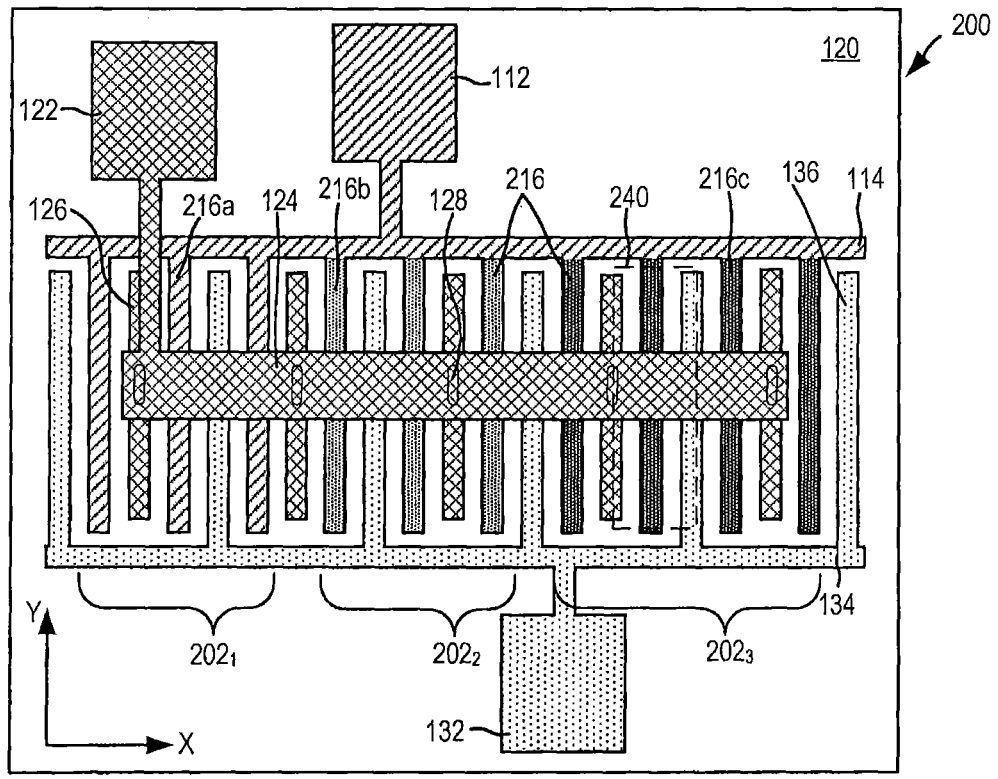
Figure 5C:
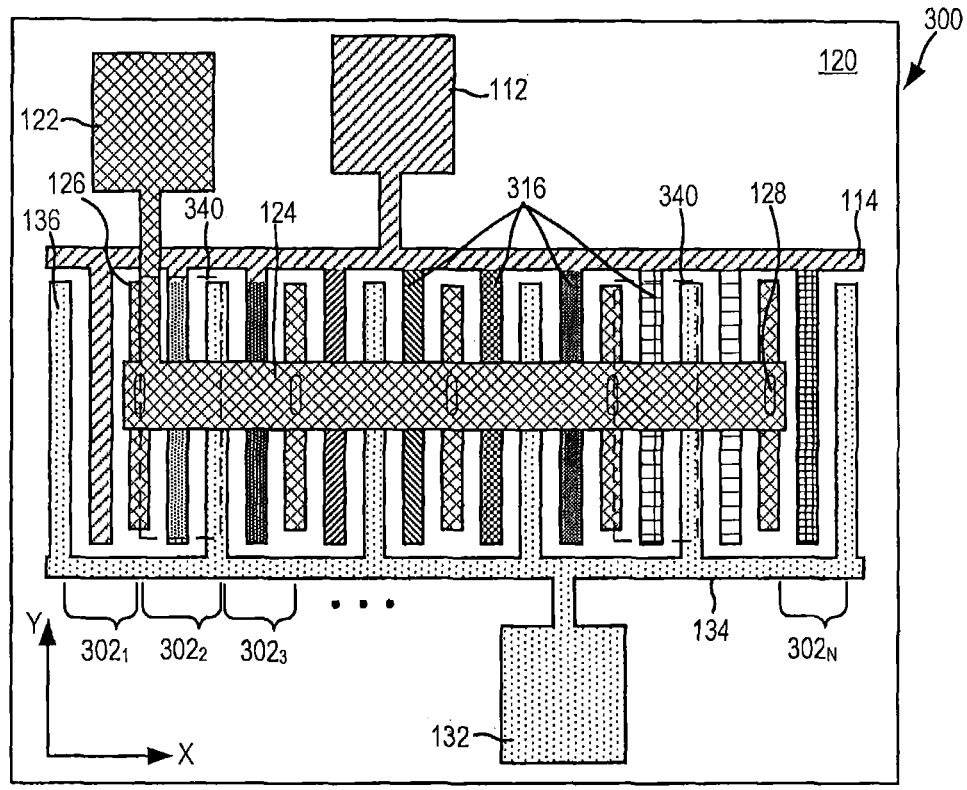

FIGS. 5A-5C are plan views of the metal layouts of three example multi-cell semiconductor devices according to certain embodiments of the present invention. The semiconductor devices of FIGS. 5A-5C correspond to the devices discussed above with reference to FIGS. 4A-4C, respectively.

As shown in FIG. 5A, a multi-cell semiconductor device 100 includes various metal patterns that are formed on a semiconductor structure 120. An example composition of the semiconductor structure 120 will be discussed in greater detail below with reference to FIGS. 8A and 8B. As shown in FIG. 5A, the multi-cell semiconductor device 100 includes a gate pad 112, a source pad 122 and a drain pad 132 that are formed on the semiconductor structure 120. The gate pad 112 is connected by a gate bus 114 to a plurality of gate fingers 116 that extend in parallel in a first direction (the y-direction). The drain pad 132 is connected to a plurality of parallel drain contacts 136 via a drain bus 134. The source pad 122 is connected to a plurality of parallel source contacts 126 via a source bus 124 that may be disposed, for example, at a different metallization layer than the gate bus 114 and the drain bus 134. The source bus 124 in the depicted embodiment runs above the gate fingers 116 and the drain contacts 136. Vertically-extending source contact plugs 128 electrically connect each source contact 126 to the source bus 124. Each gate finger 116 runs along the y-direction between a pair of adjacent source and drain contacts 126, 136. A unit cell of the transistor 100 is illustrated at box 140, and includes a gate finger 116 that extends between adjacent source and drain contacts 126, 136.

As is further shown in FIG. 5A, the gate fingers 116 may include first gate fingers 116a and second gate fingers 116b. The gate fingers 116a may be in a first region 1021 of the semiconductor structure 120, and the gate fingers 116b may be in a second region 1022 of the semiconductor structure 120. In the first region 1021, the unit cell transistors 140 (i.e., the unit cell transistors that include the gate fingers 116a) may each have a first threshold voltage value $V_{TH-1}$ along the width of each gate finger 116a. In the second region 1022, the unit cell transistors 140 (i.e., the unit cell transistors that include the gate fingers 116b) may each have a second threshold voltage value $V_{TH-2}$ along the width of each gate finger 116b. The second threshold voltage value $V_{TH-2}$ may be greater than the first threshold voltage value $V_{TH-1}$. As will be discussed below, the unit cell transistors in the first and second regions 1021 and 1022 may be made to have different threshold voltage values in a variety of ways including using different materials to form the gate fingers or changing the composition, doping concentration and/or thickness of one or more layers that underlie the gate fingers. For ease of description the gate fingers 116a of unit cell transistors having the first threshold voltage value $V_{TH-1}$ are shown using a first form of cross-hatching in FIG. 5A while the gate fingers 116b of unit cell transistors having the second threshold voltage value $V_{TH-2}$ are shown using a second form of cross-hatching. This same convention is also used in the figures depicting additional embodiments of the present invention. It will be appreciated, however, that depending upon the technique used to provide different threshold voltage values the gate fingers (e.g., gate fingers 116a and 116b) may or may not have the same composition.

In some embodiments, $V_{TH-2}$-$V_{TH-1}$ may be at least 0.1 volts. In other embodiments, $V_{TH-2}$-$V_{TH-1}$ may be at least 0.25 volts. In still other embodiments, $V_{TH-2}$-$V_{TH-1}$ may be at least 0.5 volts. In still other embodiments, $V_{TH-2}$-$V_{TH-1}$ may be at least 0.05 volts or be between 0.1-1.25 volts. In contrast, the unit cell transistors that are within a given region (e.g., the first region 1021) may each have substantially the same threshold voltage. For example, the unit cell transistors within each region may have threshold voltages that are within 0.025 volts of each other in some embodiments. In other embodiments, the unit cell transistors within each region may have threshold voltages that are within 0.01 volts of each other.

As shown in FIG. 5B, a multi-cell semiconductor device 200 according to further embodiments of the present invention may be similar to the semiconductor device 100 discussed above with reference to FIG. 5A, except that the semiconductor device 200 is divided into three regions $202_1$, $202_2$, $202_3$ instead of two regions as in the case of semiconductor device 100. In the first region $202_1$, unit cell transistors having gate fingers 216a may be disposed that each have a first threshold voltage value $V_{TH-1}$ along the width of each gate finger 216a. In the second region $202_2$, unit cell transistors having gate fingers 216b may be disposed that each have a second threshold voltage value $V_{TH-2}$ along the width of each gate finger 216b, where the second threshold voltage value $V_{TH-2}$ is greater than the first threshold voltage value $V_{TH-1}$. In the third region $202_3$, unit cell transistors having gate fingers 216c may be disposed that each have a third threshold voltage value $V_{TH-3}$ along the width of each gate finger 216c, where the third threshold voltage value $V_{TH-3}$ is greater than the second threshold voltage value $V_{TH-2}$. Elements of semiconductor device 200 that are the same as the corresponding elements of semiconductor device 100 are identified by the same reference numerals and further description of these elements is omitted.

As shown in FIG. 5C, a multi-cell semiconductor device 300 according to still further embodiments of the present invention may be similar to the semiconductor device 100, 200 that are discussed above, except that the semiconductor device 300 is divided into N regions 3021, 3022, . . . 302N instead of two regions as in the case of device 100 or three regions as in the case of device 200. Each of the N regions 3021, 3022, . . . 302N includes a single unit cell transistor 340 that has a gate finger 316. Each unit cell transistor 340 may be configured to have a threshold voltage value that is different from the threshold voltage values of all other of the unit cell transistors 340. The threshold voltage values for the unit cell transistors 340 may increase monotonically from left to right in FIG. 5C so that the semiconductor device 300 will have unit cell transistors 340 having threshold voltage values as shown in FIG. 4C that range from $V_{TH-1}$ to $V_{TH-N}$. Elements of semiconductor device 300 that are the same as the corresponding elements of semiconductor device 100 are identified by the same reference numerals and further description of these elements is omitted.

FIGS. 4A-4C and 5A-5C illustrate semiconductor device designs where different unit cell transistors have different threshold voltage values in order to provide semiconductor devices 100, 200, 300 that have variable threshold voltages that are different in different locations within the respective devices. In other embodiments, the threshold voltage may instead be made to vary within individual unit cell transistors by configuring the unit cells so that the threshold voltage varies along the gate width of at least some of the individual gate fingers (as noted above, the "width" of a gate finger refers to the distance that the gate finger extends in parallel between the source and drain contacts, and is often longer than the "length" of the gate finger). For example, FIGS. 6A and 6B are plan views of multi-cell semiconductor devices according to further embodiments of the present invention that have threshold voltage values that vary discretely along the width of each gate finger (where, as discussed above, the "width" of the gate finger is the distance that the gate finger extends in the y-direction in the figures).

Figure 6A:
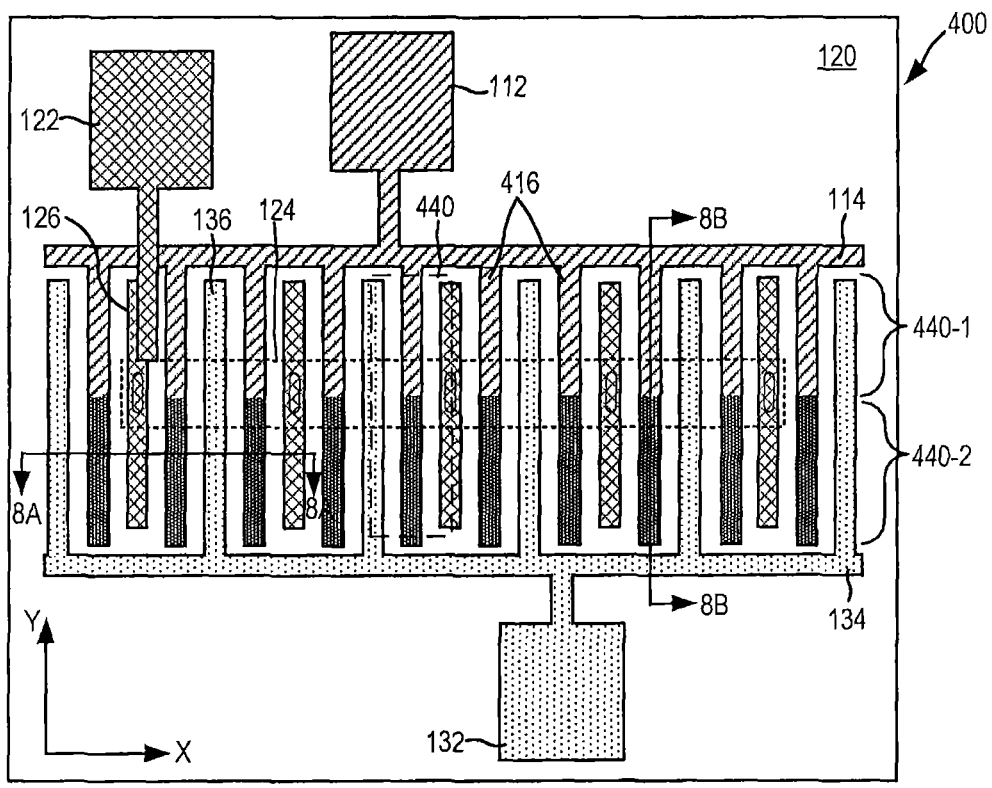
FIGS. 6A and 6B are schematic plan views of multi-cell semiconductor devices according to embodiments of the present invention that have threshold voltages that vary discretely along the width of the gate fingers thereof, with the total width of each gate finger being 125 microns.

In particular, FIG. 6A is a plan view of a multi-cell semiconductor device 400. The semiconductor device 400 is designed to have two different threshold voltage values along the width of each gate finger 416 thereof. In other words, the threshold voltage value may vary within each unit cell transistor 440. In the embodiment of FIG. 4A, a first half 440-1 of each unit cell transistor 440 may have a first threshold voltage value and the second half 440-2 of each unit cell transistor 440 may have a second threshold voltage value $V_{TH-2}$. In the depicted embodiment, the first half 440-1 of each unit cell transistor 440 is the half closest to the gate bus 114, and the second half 440-2 of each unit cell transistor 440 is the half that is remote from the gate bus 114. The second threshold voltage value $V_{TH-2}$ may be either less than or greater than the first threshold voltage $V_{TH-1}$. In FIG. 6A (as well as in the embodiments of FIGS. 6B and 9) the source bus 124 is shown in outline form to reveal the underlying metal layers in better detail.

Figure 6B:
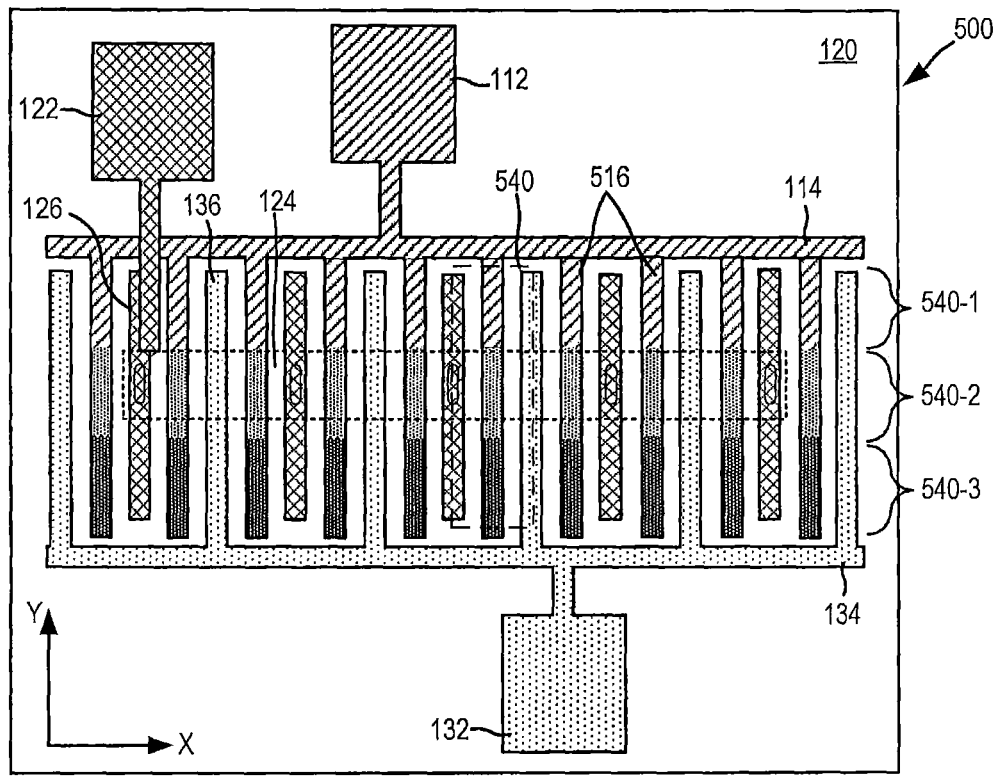

FIG. 6B is a plan view of a multi-cell semiconductor device 500 that has three different threshold voltage values along the width of each gate finger 516 thereof. In particular, an initial third 540-1 of each unit cell transistor 540 may have a first threshold voltage value $V_{TH-1}$, a middle third 540-2 of each unit cell transistor 540 may have a second threshold voltage value $V_{TH-2}$, and an end third 540-3 of each unit cell transistor 540 may have a third threshold voltage value $V_{TH-3}$. The first, second and third threshold voltage values may be different from each other.

Figure 7A:
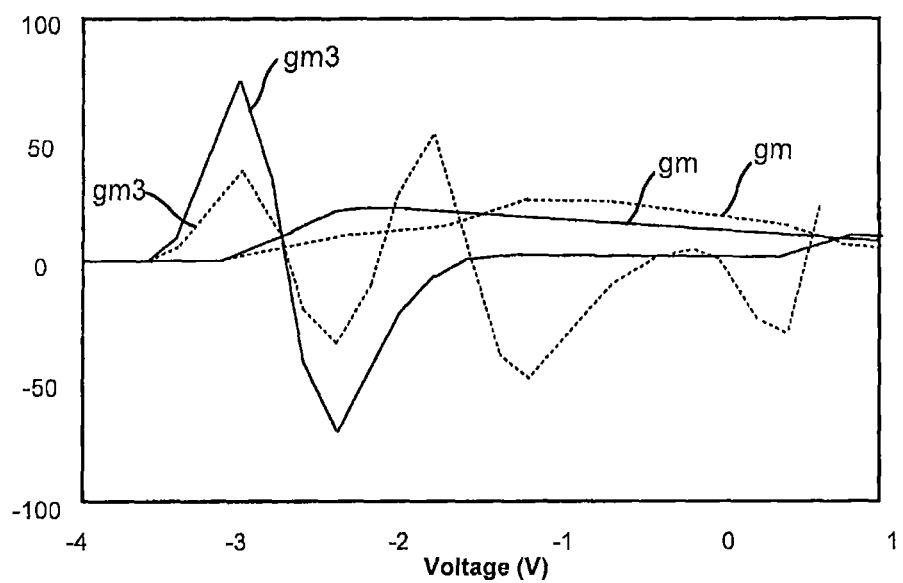
FIGS. 7A-7B are graphs illustrating the transconductance and the third order transconductance as a function of the applied threshold voltage for semiconductor devices having the designs of FIGS. 6A-6B, respectively.
Figure 7B:
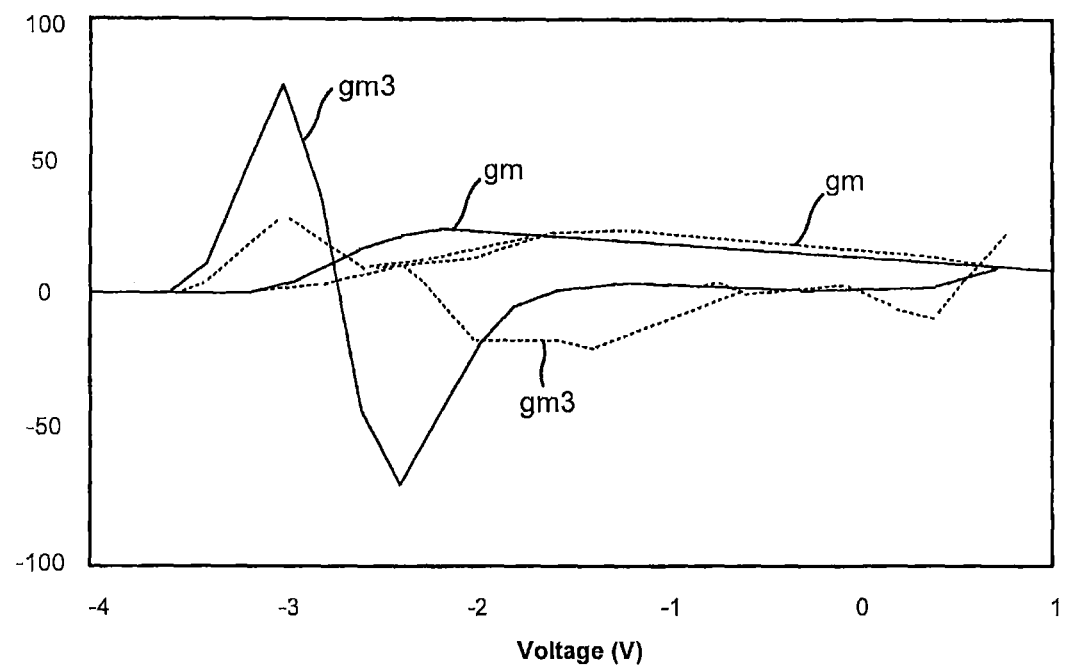

FIGS. 7A-7B are graphs illustrating the transconductance and the third order transconductance as a function of the gate-to-source voltage differential for multi-cell semiconductor devices having the designs discussed above with respect to FIGS. 6A and 6B, respectively (see the dotted lines). The graphs of FIGS. 7A and 7B also include the transconductance and the third order transconductance as a function of the gate-to-source voltage differential for the conventional semiconductor device of FIG. 1 as a point of reference (see the solid lines).

As shown in FIGS. 7A and 7B, the peak value of the third order transconductance may be reduced significantly by varying the threshold voltage along the width of each gate finger. By varying the threshold voltage, different portions of the device may turn-on at different applied gate voltages. As a result the device may have improved linearity. As shown, the more discrete levels of threshold voltage provided within the device the greater the improvement in the reduction in the third order transconductance. In particular, the conventional semiconductor device exhibited a peak third order transconductance value of −70.2. As shown in FIG. 7A, by designing the device to have two different threshold voltage values in different regions thereof, the peak third order transconductance value is reduced to −49.78, or by about 30%. As shown in FIG. 7B, by designing the device to have three different threshold voltage values in different regions thereof, the peak third order transconductance value is reduced to −22.5, or by about 67%. In each case, the non-linearities in the third order transconductance extends over a greater voltage range, but the peak value, which is what generally creates issues, may be substantially reduced.

Figure 8A:
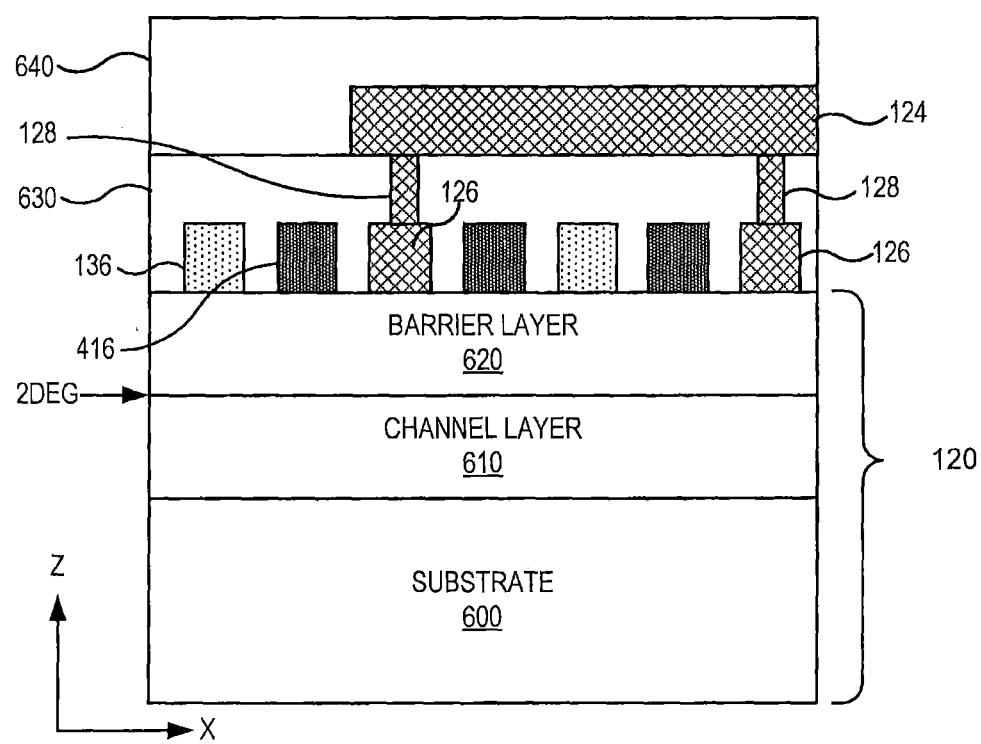
FIG. 8A is a cross-sectional view taken along line 8A-8A of FIG. 6A.

FIG. 8A is a cross-sectional diagram taken along line 8A-8A of FIG. 6A that shows a portion of a cross-section of the multi-cell semiconductor device 400. The semiconductor device 400 includes a semiconductor structure 120 including a substrate 600, which may, for example, include 4H—SiC or 6H—SiC. A channel layer 610 is formed on the substrate 600, and a barrier layer 620 is formed on the channel layer 610. The channel layer 610 and the barrier layer 620 may include Group III-nitride based materials, with the material of the barrier layer 620 having a higher bandgap than the material of the channel layer 610. For example, the channel layer 610 may comprise GaN, while the barrier layer 620 may comprise AlGaN. In some embodiments, either or both the channel layer 610 and the barrier layer 620 may not be intentionally doped layers. The channel layer 610 and the barrier layer 620 may have the same conductivity type (e.g., n-type). As shown in FIG. 8A, the metal contact structures including the gate fingers 416, the source contacts 126, the drain contacts 136, the source bus 124 and the source contact plugs 128 may be formed in one or more interlayer insulating layers 630, 640 that are formed on the barrier layer 620, as may the other metal contact structures shown in FIG. 6A. The interlayer insulating layers 630, 640 may include a dielectric material, such as SiN, $SiO_2$, etc.

Due to the difference in bandgap between the barrier layer 620 and the channel layer 610 and piezoelectric effects at the interface between the barrier layer 620 and the channel layer 610, a two dimensional electron gas (2DEG) is induced in the channel layer 610 at a junction between the channel layer 610 and the barrier layer 620. The 2DEG acts as a highly conductive layer that allows conduction between the source and drain regions of the device that are beneath a source contact segment 126 and a drain contact 136, respectively. The source contact 126 and the drain contact 136 are formed on the barrier layer 620. A gate finger 416 is formed on the barrier layer 620 between the drain contact 136 and the source contact 126. The source bus 124 extends over the source contacts 126, drain contacts 136 and gate fingers 416. The source contacts 126 physically and electrically connect to the source bus 124 through respective vertical contact plugs 128 that penetrate the first interlayer insulating layer 630.

The material of the gate fingers 416 may be chosen based on the composition of the barrier layer 620. In certain embodiments, conventional materials capable of making a Schottky contact to a nitride based semiconductor material may be used, such as Ni, Pt, NiSix, Cu, Pd, Cr, W and/or WSiN. The drain contacts 136 and source contacts 126 may, for example, include a metal, such as TiAlN, that can form an ohmic contact to GaN and/or AlGaN.

While cross-sectional diagrams are not provided for various of the other semiconductor devices according to embodiments of the present invention that are disclosed herein, it will be appreciated that each of those devices may have the same general semiconductor structure 120 as shown in FIG. 8A. Particular embodiments may have specific variations, such as changes in doping concentrations or recesses in the barrier layer 620, as described herein. It will also be appreciated that any of the disclosed embodiments may include additional layers such as, for example, buffer layers or the like that are not shown in FIG. 8A.

Figure 8B:
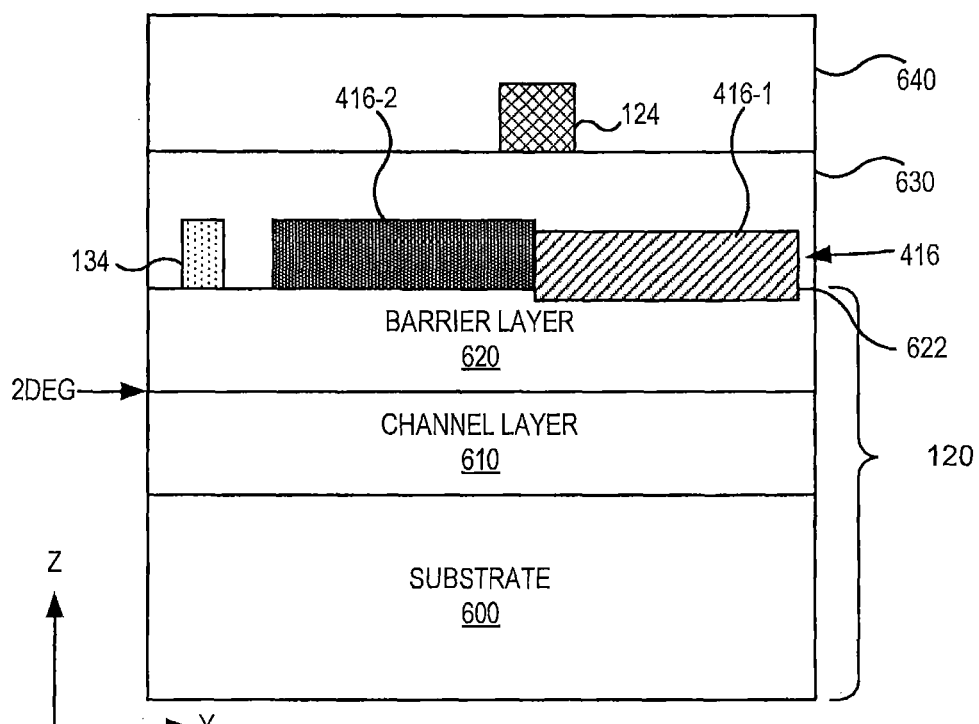
FIG. 8B is a cross-sectional view taken along line 8B-8B of FIG. 6A.

FIG. 8B is a cross-sectional diagram taken along line 8B-8B of FIG. 6A that shows a cross-section of the multi-cell semiconductor device 400 of FIG. 6A taken in the y-direction. The semiconductor device 400 includes the above-described semiconductor structure 120 that includes a substrate 600, a channel layer 610, and a barrier layer 620. The gate finger 416 extends along the semiconductor structure in the y-direction. As shown in FIG. 8B, the upper surface of the barrier layer 620 may be recessed on the right side of the semiconductor structure 120. The gate finger 416 may have a consistent thickness in the z-direction. However, because of the recess 622 in the barrier layer 620, a bottom surface of the first half 416-1 of gate finger 416 may be closer to the channel layer 610 than is a bottom surface of the second half 416-2 of gate finger 416. As a result, the threshold voltage value $V_{TH-1}$ for the first half 416-1 of each gate finger 416 may be different than the threshold voltage value $V_{TH-2}$ for the second half 416-2 of each gate finger 416.

The barrier layer 620 may be recessed so that a top surface of the portion of the barrier layer 620 that is under the first half 416-1 of each gate finger 416 may be lower in the z-direction than the top surface of the portion of the barrier layer 620 that is under the second half 416-2 of each gate finger 416 by, for example, between 1 and 15 nm. This distance may be referred to herein as the "depth" of the recess 622. The depth of the recess 622 may be chosen to obtain a desired amount of difference between the first and second threshold voltage values $V_{TH-1}$, $V_{TH-2}$.

Figure 9:
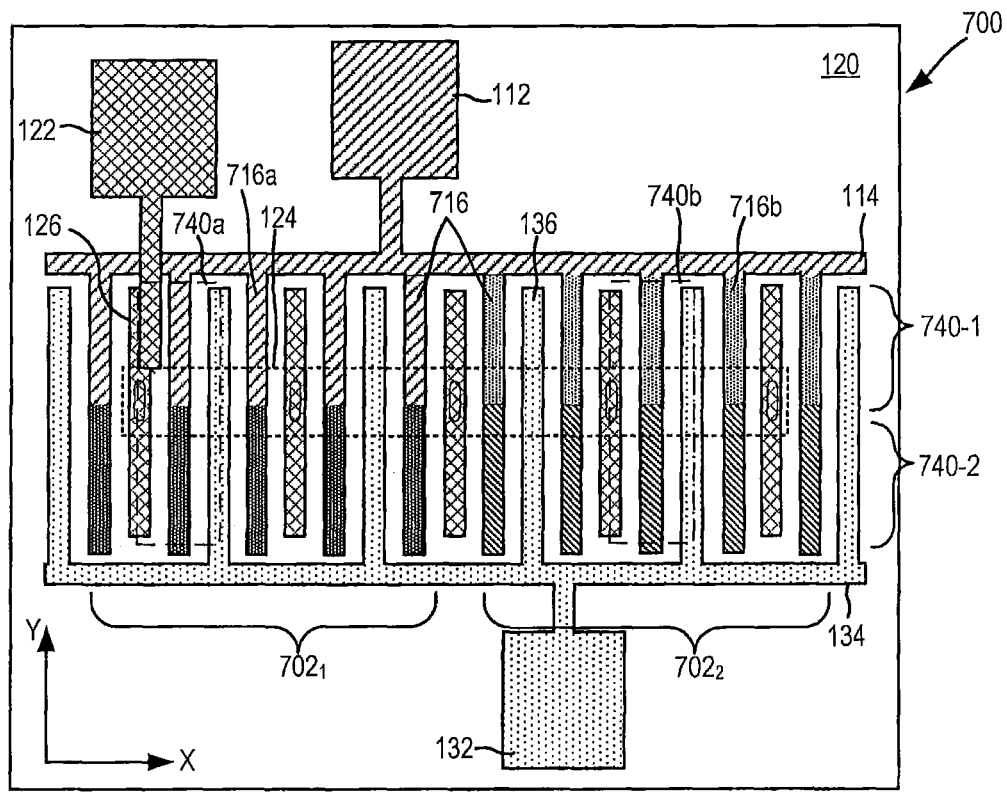
FIG. 9 is a schematic plan view of a multi-cell semiconductor device according to further embodiments of the present invention.

FIG. 9 is a schematic plan view of a multi-cell semiconductor device 700 according to further embodiments of the present invention. The semiconductor device 700 combines aspects of the semiconductor device 100 of FIG. 5A and the semiconductor device 400 of FIG. 6A. As shown in FIG. 9, the semiconductor device 700 includes a plurality of gate fingers 716. The gate fingers 716 may include first gate fingers 716a and second gate fingers 716b. The gate fingers 716a may be in a first region 7021 of the semiconductor structure 120, and the gate fingers 716b may be in a second region 7022 of the semiconductor structure 120. The gate fingers 716a may each be part of a unit cell transistor 740a, and the gate fingers 716b may each be part of a unit cell transistor 740b. Each unit cell transistor 740a is designed to have two different threshold voltage values along the width thereof. In particular, a first half 740-1 of each unit cell transistor 740a may have a first threshold voltage value $V_{TH-1}$ and the second half 740-2 of each unit cell transistor 740a may have a second threshold voltage value $V_{TH-2}$.

In the second region 7022, each unit cell transistor 740b is similarly designed to have two different threshold voltage values along the width thereof. In particular, a first half 740-1 of each unit cell transistor 740b may have a third threshold voltage value $V_{TH-3}$ and the second half 740-2 of each unit cell transistor 740b may have a fourth threshold voltage value $V_{TH-4}$. The first through fourth threshold voltage values $V_{TH-1}$ through $V_{TH-4}$ may comprise different threshold voltage values.

It will be appreciated that which particular unit cell transistors, and/or portions thereof, that have the different threshold voltage values may be arbitrarily selected. Thus, while the graphs of FIGS. 4A-4C and the plan views of FIGS. 5A-5C, 6A-6B and 9 illustrate multi-cell semiconductor devices that have unit cell transistors with threshold voltages that monotonically increase (either discretely or continuously) along the x-direction in the figures, embodiments of the present invention are not limited thereto. This is shown schematically with reference to FIGS. 10A-10C, which are schematic graphs illustrating the threshold voltage variation in multi-cell semiconductor devices according to further embodiments of the present invention.

Figure 10A:
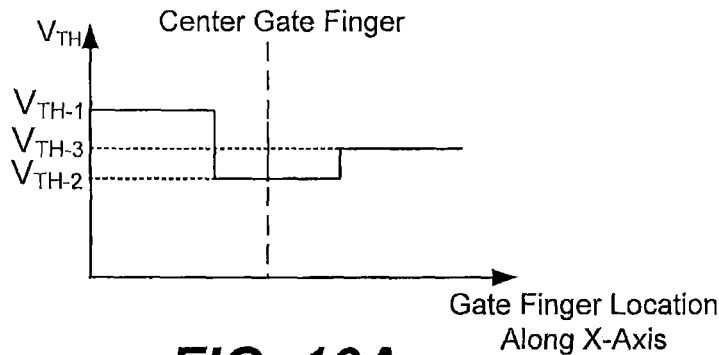
FIGS. 10A-10C are schematic graphs illustrating the threshold voltage variation in multi-cell transistors according to further embodiments of the present invention.

As shown in FIG. 10A, in an example embodiment, a first subset of the unit cell transistors are designed to have a first threshold voltage value $V_{TH-1}$, a second subset of the unit cell transistors are designed to have a second threshold voltage value $V_{TH-2}$, and a third subset of the unit cell transistors are designed to have a third threshold voltage value $V_{TH-3}$. The first subset of the unit cell transistors is on the left hand side of the transistor, the second subset of the unit cell transistors is in the middle of the transistor, and the third subset of the unit cell transistors is on the right hand side of the transistor. As shown in FIG. 10A, the first threshold voltage value $V_{TH-1}$ is the highest value, the second threshold voltage value $V_{TH-2}$ is the lowest threshold voltage value, and the third threshold voltage value $V_{TH-3}$ is an intermediate threshold voltage value.

Figure 10B:
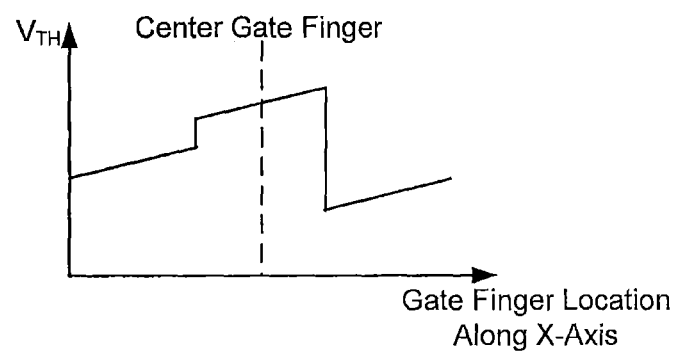

Referring next to FIG. 10B, it can be seen that in another example embodiment, a similar approach may be taken in a multi-cell semiconductor device in which every unit cell transistor has a different threshold voltage value. In the embodiment of FIG. 10B, the unit cell transistors are divided into three subsets of adjacent unit cell transistors, where each subset of unit cell transistors has monotonically increasing threshold voltage values. While FIG. 10B shows that the unit cell transistors may be divided into three subsets of adjacent unit cell transistors, it will be appreciated that more or fewer subsets may be provided.

Figure 10C:
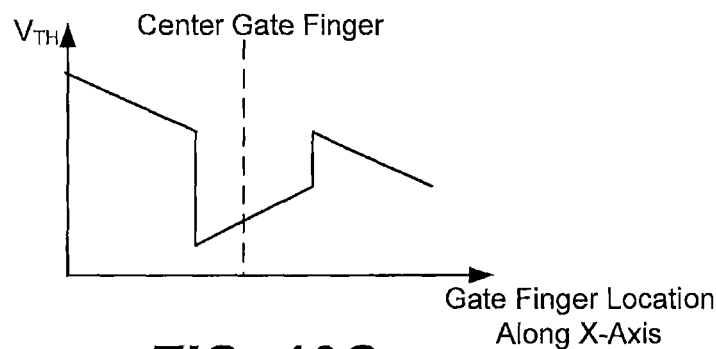

Referring next to FIG. 10C, in yet another example embodiment, a multi-cell semiconductor device may have subsets of adjacent unit cell transistors that have monotonically increasing threshold voltage values as well as subsets of adjacent unit cell transistors that have monotonically decreasing threshold voltage values.

It will be appreciated that FIGS. 10A-10C show three of many possible designs. In the extreme, a semiconductor device may have a large number of unit cell transistors (e.g., 100), each of which has a different threshold voltage value, where the unit cell transistors are randomly distributed throughout the device. It will also be appreciated that the same sorts of variation may be done along the width of each unit cell transistor.

Thus, according to embodiments of the present invention, RF power amplifiers or other multi-cell transistors may be provided that include a plurality of unit cell transistors on a common semiconductor structure, the unit cell transistors electrically connected in parallel, and each unit cell transistor including a respective gate finger, where threshold voltages for the gate fingers thereof are different. The respective threshold voltages of different sets of one or more of the unit cell transistors may differ by at least 0.1 volts. The differences in threshold voltage may be achieved, for example, by varying a thickness of gallium nitride based barrier layer in different regions of the semiconductor device.

The respective gate fingers may extend in parallel to each other, and in some embodiments the threshold voltages for the plurality of gate fingers may monotonically increase across the semiconductor device as shown, for example, in FIGS. 4A-4C. In other embodiments, the threshold voltages for the plurality of gate fingers may monotonically decrease across the semiconductor device. This is also shown in FIGS. 4A-4C if the semiconductor device is viewed from right-to-left as opposed to left-to-right. In still other embodiments, the threshold voltages for the plurality of gate fingers may monotonically increase across a first portion of the semiconductor device and then monotonically decrease across a second portion of the semiconductor device that is adjacent the first portion as shown, for example, in FIGS. 10A-10C. Alternatively, the plurality of gate fingers may monotonically decrease across a first portion of the semiconductor device and then monotonically increase across a second portion of the semiconductor device that is adjacent the first portion, which is also shown in each of FIGS. 10A-10C. The threshold voltages for the plurality of gate fingers may vary symmetrically across the semiconductor device in some embodiments, and may vary asymmetrically across the semiconductor device in other embodiments.

As discussed above with reference to FIG. 8B, one technique for varying the threshold voltage in different regions of the transistors according to embodiments of the present invention is to change the thickness of the barrier layer under portions of some or all of the gate fingers. This technique may be used, for example, to form the semiconductor devices 400 and 500 of FIGS. 6A and 6B, respectively. Similarly, the thickness of the barrier layer may be varied underneath different subsets of the unit cell transistors. Such a technique may be used to form the semiconductor devices 100, 200 and 300 of FIGS. 5A-5C, respectively. These two techniques may be combined to form the semiconductor device 700 of FIG. 9. It will be appreciated, however, that other techniques may be used to vary the threshold voltage in different regions of the semiconductor devices according to embodiments of the present invention.

Figure 11A:
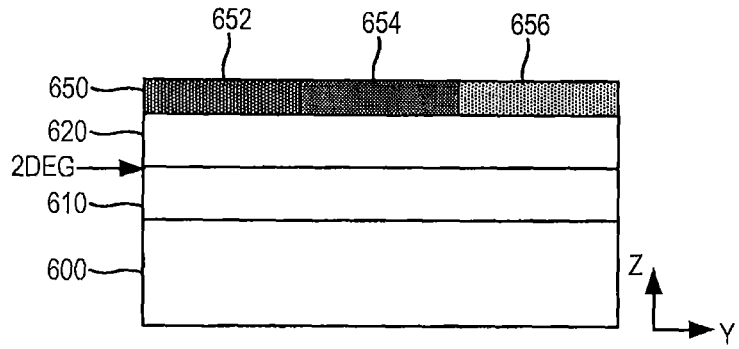
FIGS. 11A-11C are schematic cross-sectional views of multi-cell semiconductor devices according to further embodiments of the present invention.

For example, referring to FIG. 11A, according to further embodiments of the present invention, the threshold voltage may be varied by using different metals or metal alloys to form different gate fingers and/or different portions of the same gate finger 650. As shown in FIG. 11A, a gate finger 650 is formed on the barrier layer 620. The gate finger 650 extends along the y-direction, and is formed using three different metals or metal alloys 652, 654, 656. The different metals may be selected to achieve a desired variation in the threshold voltages under the three different sections of the gate finger 650.

Figure 11B:
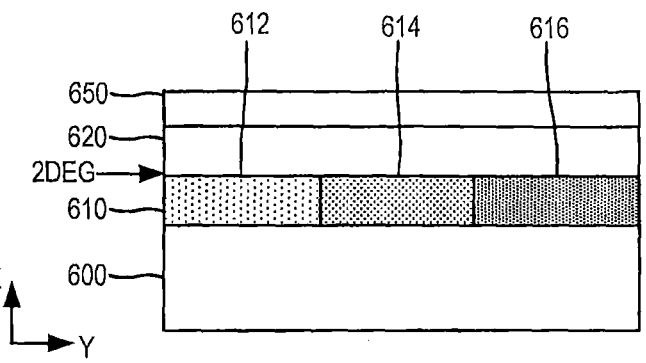

Referring next to FIG. 11B, in another approach, portions of the channel layer 610 may be doped to change the threshold voltage under different portions of the gate fingers 650. As shown in FIG. 11B, portions 612, 614, 616 of the channel layer 610 that are under different portions of one or more of the gate fingers 650 may have different dopant concentrations. The doping concentrations (e.g., n-type dopants which may be, for example, silicon if the channel layer 610 comprises a gallium nitride based channel layer) may be selected to achieve a desired variation in the threshold voltages under the three different sections of the gate finger 650. In some embodiments, p-type dopants could be used instead or a combination of n-type dopants in some portions and p-type dopants in other portions. It may be possible to achieve the same effect by doping sections of the barrier layer 620.

Figure 11C:
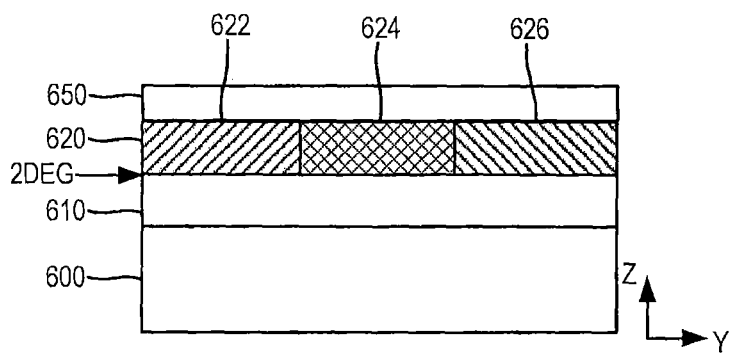

Referring to FIG. 11C, in yet another approach, different portions of the barrier layer 620 may have different material compositions. For example, the barrier layer may comprise an $Al_xGa_{1-x}N$ layer. The value of "x" may be different in each of various portions 622, 624, 626 of the barrier layer 620 that are under different portions of the gate fingers 650 in order to vary the threshold voltage value.

While, FIGS. 8A and 11A-11C show several example ways for varying the threshold voltage in different regions of a multi-gate finger transistor, it will be appreciated that embodiments of the present invention are not limited to these techniques. For example, in yet another approach, insulating layers having different thicknesses may be formed between the barrier layer between respective subsets of the gate fingers to provide unit cell transistors having different threshold voltage values. The same technique may be used along the width of the gate fingers to provide unit cell transistors that have varied threshold voltage values.

Figure 12:
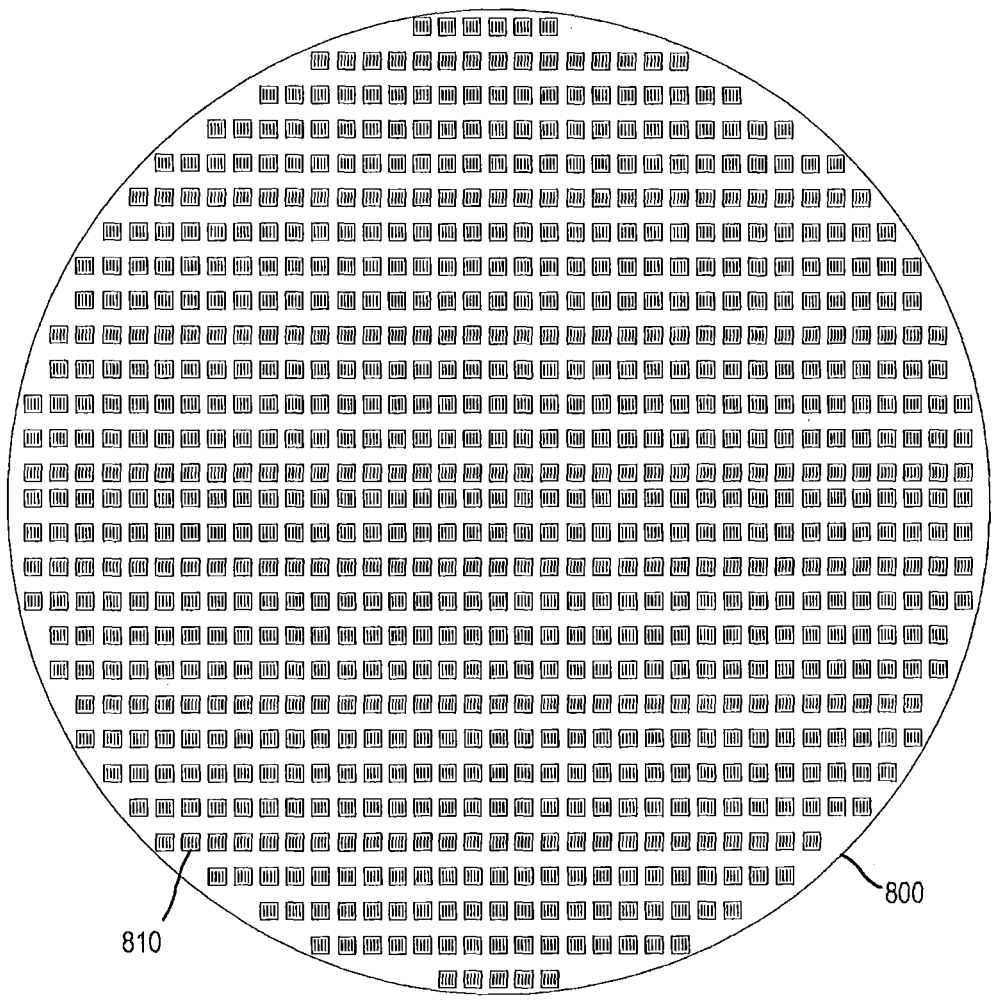
FIG. 12 is a schematic plan view of a semiconductor wafer having a plurality of semiconductor devices according to embodiments of the present invention formed thereon.

Referring next to FIG. 12, a semiconductor wafer 800 is schematically illustrated that includes a plurality of multi-cell semiconductor devices 810 formed thereon. As shown in FIG. 12, a large number of multi-cell semiconductor devices 810 may be formed on wafer 800. In the depicted embodiment, approximately forty multi-cell semiconductor devices 810 fit along the diameter of the wafer 800. More or fewer multi-cell semiconductor devices 810 may be provided. Moreover, while the individual multi-cell semiconductor devices 810 are illustrated in FIG. 12 as being square, it will be appreciated that more commonly each multi-cell semiconductor devices has a generally rectangular shape, with the length of adjacent sides varying by perhaps a factor of ten in example embodiments.

Due to variations in semiconductor growth and processing techniques, there typically is some variation in the threshold voltage across a semiconductor wafer. For example, a typical variation may be in the range of 0.1 to 0.4 volts. However, given the large number of multi-cell semiconductor devices 810 formed on the wafer 800, the variation in threshold voltage due to processing variations within the footprint of any particular multi-cell semiconductor device will be much smaller, such as in the range of 0.0001 to 0.0004 volts. Such small variations do essentially nothing to spread out the device turn-on. As discussed above, pursuant to embodiments of the present invention, larger variations in the threshold voltage values may be deliberately engineered into the device design, such as variations on the order of 0.05 to 1.25 volts. Such variations may be used to spread out the threshold voltages over which different portions of a multi-cell semiconductor device turn on, thereby significantly lowering the peak third order transconductance values in order to provide improved linearity.

Figure 13:
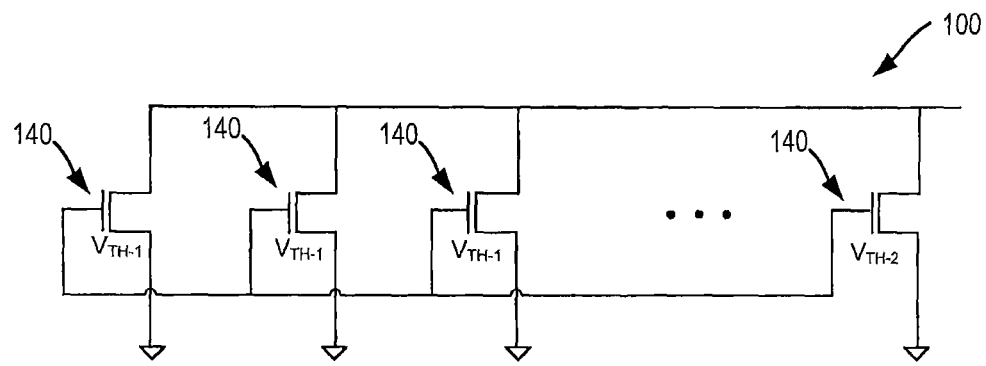
FIG. 13 is a circuit diagram of a multi-cell semiconductor device according to some embodiments of the present invention.

FIG. 13 is a schematic circuit diagram of the multi-cell semiconductor device 100 of FIG. 5A. As shown in FIG. 13, the semiconductor device 100 includes a plurality of unit cell transistors 140. The unit cell transistors 140 are electrically connected in parallel. A first subset of the unit cell transistors 140 may have a first threshold voltage value $V_{TH-1}$ while a second subset of the unit cell transistors 140 may have a second threshold voltage value $V_{TH-2}$ that is different than the first threshold voltage value $V_{TH-1}$.

Figure 14:
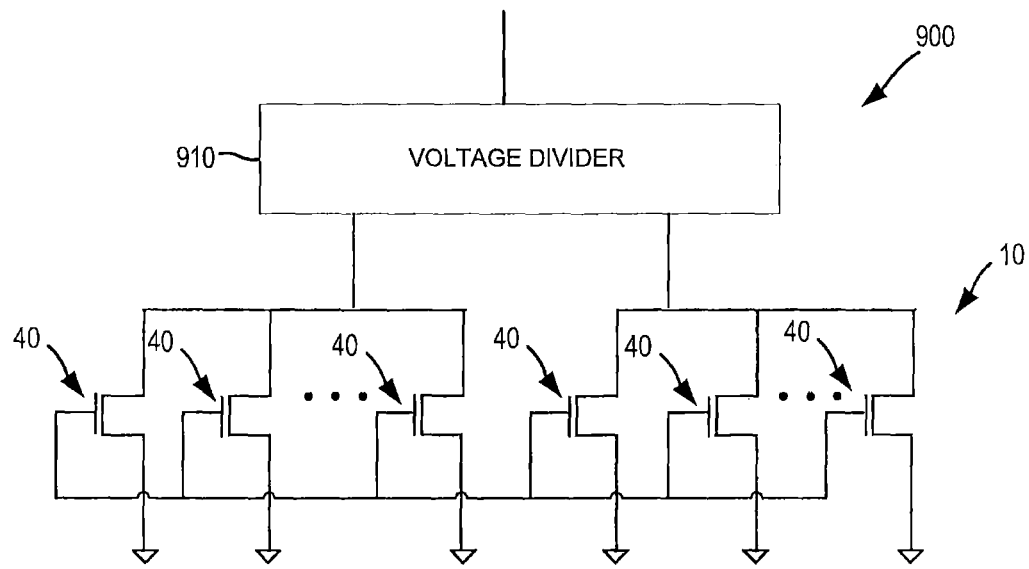
FIG. 14 is a circuit diagram of a multi-cell semiconductor device according to further embodiments of the present invention.

While engineering the threshold voltage is one way of improving the linearity of a multi-cell semiconductor device, it will be appreciated that the same effect may be achieved by applying different gate voltages to different portions of the device. FIG. 14 schematically illustrates this approach.

In particular, as shown in FIG. 14, according to further embodiments of the present invention, different threshold voltages may be applied to different portions of a semiconductor device in order to smooth out the third order transconductance at device turn-on in order to provide improved linearity. As shown in FIG. 14, a semiconductor device 900 according to embodiments of the present invention may include a conventional semiconductor device such as the semiconductor device 10 of FIG. 1. As described above with reference to FIG. 1, and as shown in circuit diagram format in FIG. 14, the conventional semiconductor device 10 may include a plurality of unit cell transistors 40 that are formed on a common wide bandgap semiconductor structure and that are electrically connected in parallel. Each unit cell transistor 40 may include a gate finger. The threshold voltage may be the same along the width of each gate finger, and each unit cell transistor 40 may have the same threshold voltage.

As described above, the conventional semiconductor device 10 may exhibit large third order transconductance values at device turn-on as all of the unit cell transistors 40 will turn on to the same degree in response to application of a threshold voltage. In order to avoid this, the semiconductor device 900 further includes a voltage divider circuit 910. The voltage divider circuit 910 may receive a voltage signal at an input thereof and may output a plurality of output voltage signals in response thereto. Each output voltage signal may have a different value. In the depicted embodiment, the voltage divider 910 has two outputs, but the voltage divider 910 may have more than two outputs in other embodiments.

As is also shown in FIG. 14, each output of the voltage divider 910 may be coupled to a subset of the unit cell transistors 40 and applied to the gate fingers thereof. Thus, the gate fingers of a first subset of the unit cell transistors 40 receive the first output voltage signal from the voltage divider 910, and the gate fingers of a second subset of the unit cell transistors 40 receive the second output voltage signal from the voltage divider 910. The first and second output voltage signals of the voltage divider 910 may differ, for example, by at least 0.1 volts. In some embodiments, the first and second output voltage signals of the voltage divider 910 may differ, for example, by at least 0.25 volts. In other embodiments, the first and second output voltage signals of the voltage divider 910 may differ, for example, by at least 0.5 volts. In still other embodiments, the first and second output voltage signals of the voltage divider 910 may differ, for example, by between 0.1 and 1.25 volts. Since the gate fingers of he first and second subsets of unit cell transistors 40 receive different voltages, the unit cell transistors 40 in these subsets may turn on at different degrees. As described above, by spreading the turn-on voltage for various groups of unit cell transistors, the peak third order transconductance value may be reduced. If the voltage divider 910 has more than two outputs, then the unit cell transistors 40 of semiconductor device 10 may be divided into more than two subgroups, with each subgroup receiving one of the outputs of the voltage divider.

Figure 15:
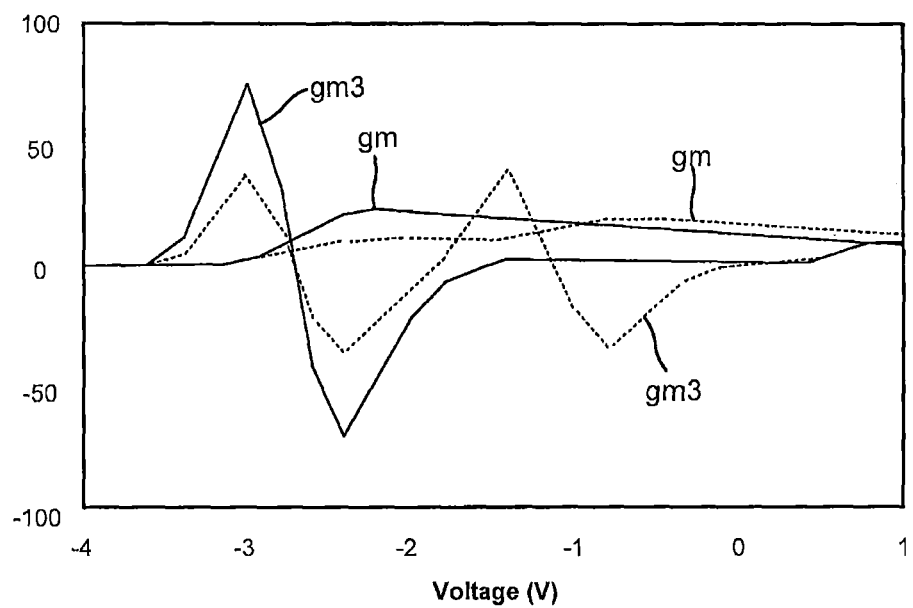
FIG. 15 is a graph illustrating the transconductance and the third order transconductance as a function of the applied threshold voltage for a semiconductor device having the design of FIG. 14 and gate fingers having a total width of 125 microns.

FIG. 15 is a graph illustrating the transconductance and the third order transconductance as a function of the applied threshold voltage for the semiconductor device 900 of FIG. 14 (the dotted lines in FIG. 15) as compared to a conventional device (the solid lines in FIG. 15). As shown in FIG. 15, the peak third order transconductance value is reduced in half as compared to the conventional device.

Figure 16:
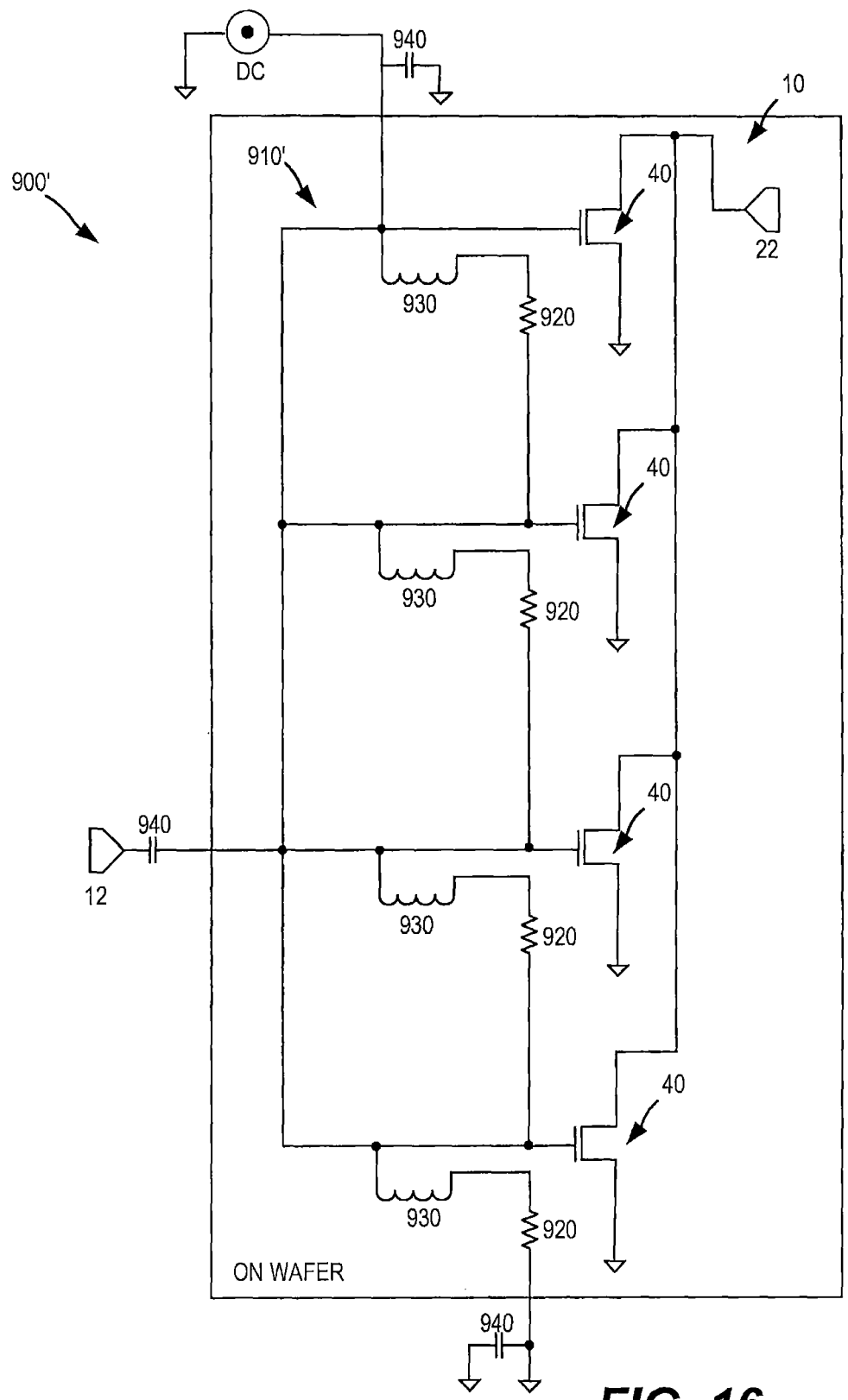
FIG. 16 is a schematic circuit diagram of a semiconductor device according to embodiments of the present invention that includes an on-wafer voltage divider.

FIG. 16 is a circuit diagram that schematically illustrates how a voltage divider may be implemented on the wafer in order to implement a semiconductor device 900' that is similar to the semiconductor device 900 of FIG. 14. As shown in FIG. 16, a voltage divider circuit 910' may be implemented using a series of resistors 920 that are disposed between the gate fingers of the unit cell transistors 40 of the semiconductor device 10 of FIG. 1. The resistors 920 may be sized to create differences in the voltage applied to the gate fingers of adjacent unit cell transistors 40 in response to application of a voltage to the gate. In the embodiment of FIG. 16, a total of four unit cell transistors 40 are shown by way of example, and the voltage divider 910'. As a result, a different voltage will be applied to the gate fingers of the respective unit cell transistors 40 in response to application of a voltage to the gate (i.e., in the embodiment of FIG. 16, every unit cell transistor 40 receives a different gate voltage). It will be appreciated that in other embodiments subsets of the gate fingers may receive the same gate voltages. For example, in another embodiment, each unit cell transistor 40 in FIG. 16 could be replaced with a two, three, four or more unit cell transistors 40 that are disposed in parallel. In such a device, the unit cell transistors 40 would turn-on at four different rates (degrees) in response to application of a gate voltage. four Inductors 930 may be provided for DC coupling and by-pass capacitors 940 may be added for RF decoupling. The resistors 920 may be formed on wafer by, for example, depositing conductive materials that have a different (higher) resistance than the remainder of the conductive lines or by changing the properties of selected portions of the conductive lines (e.g., by oxidization). Such techniques for forming on-wafer resistors are well-known in the art. The inductors 930 may also be implemented on wafer. For example, the inductors 930 may be implemented as meandered conductive lines on the wafer. In the depicted embodiment, the capacitors 940 are formed off of the wafer.

Figure 17:
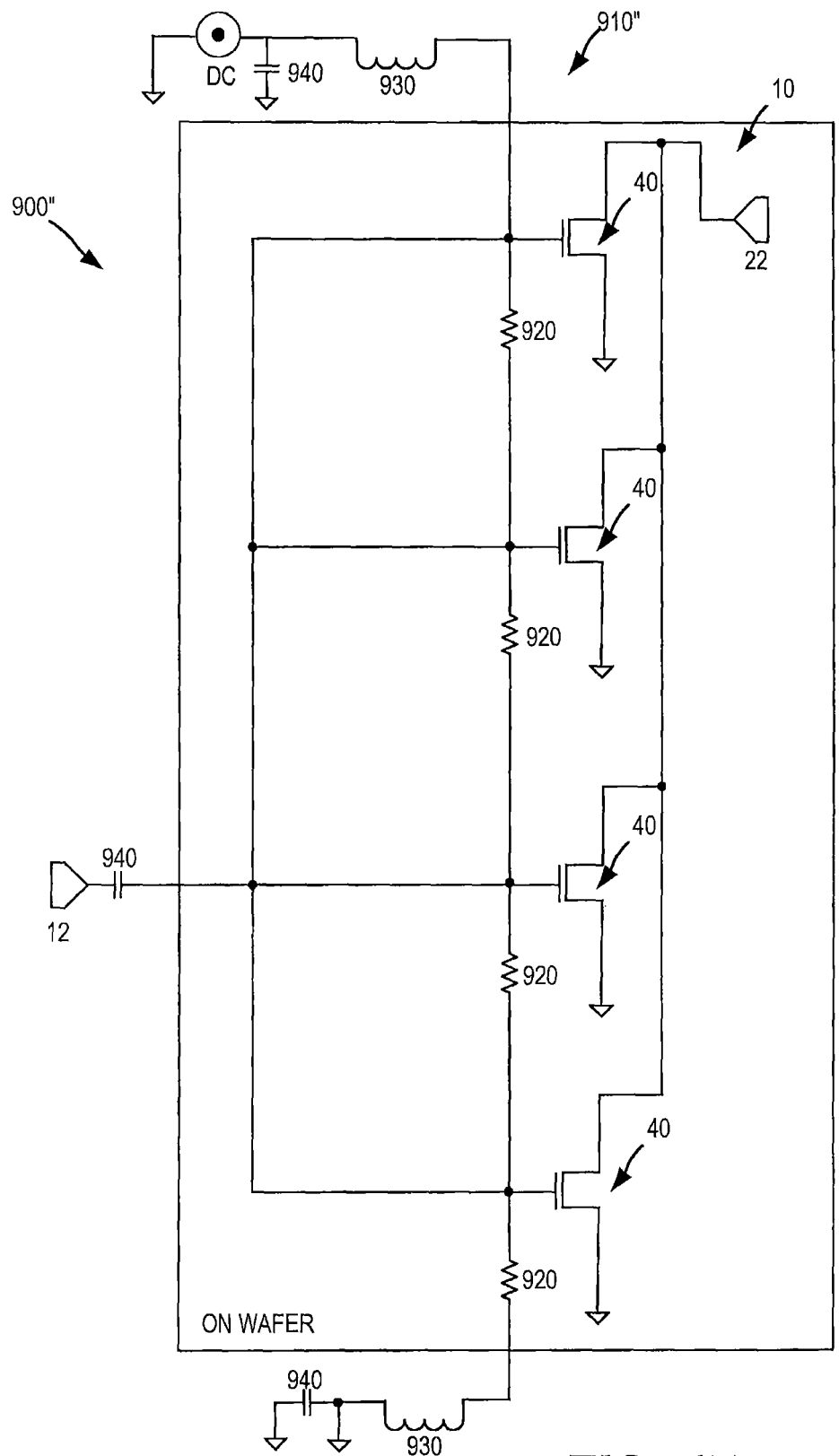
FIG. 17 is a schematic circuit diagram of a semiconductor device according to further embodiments of the present invention that includes a voltage divider that is partially implemented on-wafer.

FIG. 17 is a schematic circuit diagram of a semiconductor device 900" according to further embodiments of the present invention that includes a voltage divider that is partially implemented on-wafer. As shown in FIG. 17, the semiconductor device 900" is very similar to the semiconductor device 900' of FIG. 16, except that the inductors 930 of the voltage divider 910" of semiconductor 900" are implemented off the wafer. Such an implementation may be advantageous in some embodiments because the size of the necessary inductance may be large in some cases, which may make it difficult to implement on the wafer, and/or because the associated loss may be reduced if the inductors 930 are implemented separately off the wafer (as are the capacitors 940). As the semiconductor device 900" otherwise is identical to the semiconductor device 900' of FIG. 16, further description thereof will be omitted.

Embodiments of the present invention may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

In particular embodiments of the present invention, the substrate 600 may be a semi-insulating silicon carbide (SiC) substrate that may be, for example, 4H polytype of silicon carbide. Other silicon carbide candidate polytypes include the 3C, 6H, and 15R polytypes.

Optional buffer, nucleation and/or transition layers (not shown) may be provided on the substrate 600 beneath the channel layer 610. For example, an AlN buffer layer may be included to provide an appropriate crystal structure transition between the silicon carbide substrate and the remainder of the device. Additionally, strain balancing transition layer(s) may also be provided as described, for example, in commonly assigned U.S. Publication 2003/0102482A1, published Jun. 5, 2003, and entitled "Strain Balanced Nitride Hetrojunction Transistors And Methods Of Fabricating Strain Balanced Nitride Heterojunction Transistors," the disclosure of which is incorporated herein by reference as if set forth fully herein. Moreover, one or more capping layers, such as SiN capping layers, may be provided on the barrier layer 620.

Silicon carbide has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

In some embodiments of the present invention, the channel layer 610 is a Group III-nitride, such as $Al_xGa_{1-x}N$ where $0 \le x < 1$, provided that the energy of the conduction band edge of the channel layer 610 is less than the energy of the conduction band edge of the barrier layer 620 at the interface between the channel and barrier layers. In certain embodiments of the present invention, $x=0$, indicating that the channel layer 610 is GaN. The channel layer 610 may also be other Group III-nitrides such as InGaN, AlInGaN or the like. The channel layer 610 may be undoped or unintentionally doped and may be grown to a thickness of greater than about 20 Å. The channel layer 610 may also be a multi-layer structure, such as a superlattice or combinations of GaN, AlGaN or the like.

The channel layer 610 may have a bandgap that is less than the bandgap of the barrier layer 620, and the channel layer 610 may also have a larger electron affinity than the barrier layer 620. In certain embodiments of the present invention, the barrier layer 620 is AlN, AlInN, AlGaN or AlInGaN. In particular embodiments of the present invention, the barrier layer 620 is thick enough and has a high enough Al composition and doping to induce a significant carrier concentration at the interface between the channel layer 610 and the barrier layer 620.

The barrier layer 620 may be a Group III-nitride and has a bandgap larger than that of the channel layer 610 and a smaller electron affinity than the channel layer 610. Accordingly, in certain embodiments of the present invention, the barrier layer 620 may include AlGaN, AlInGaN and/or AlN or combinations of layers thereof. The barrier layer 620 may, for example, be from about 0.1 nm to about 30 nm thick. In certain embodiments of the present invention, the barrier layer 620 is undoped or doped with an n-type dopant to a concentration less than about $10^{19}$ $cm^{-3}$. In some embodiments of the present invention, the barrier layer 620 is $Al_xGa_{1-x}N$ where $0<x<1$. In particular embodiments, the aluminum concentration is about 25%. However, in other embodiments of the present invention, the barrier layer 620 comprises AlGaN with an aluminum concentration of between about 5% and about 100%. In specific embodiments of the present invention, the aluminum concentration is greater than about 10%.

While embodiments of the present invention are illustrated with reference to a gallium nitride based HEMT structure, the present invention is not limited to such devices. Thus, embodiments of the present invention may be suitable for use in any field effect transistor, and can be used in devices that do or do not have unit cell structures. It will likewise be appreciated that the techniques disclosed herein may also be used in material systems other than gallium nitride based material systems.

As discussed above, gallium nitride based HEMT devices are well suited for many RF power amplifier applications, particularly in wireless communications applications, due to their high power handling capabilities. However, gallium nitride based HEMT devices may exhibit reduced linearity as compared to other high power RF power amplifier technologies such as silicon-based LDMOS power amplifiers. As described above, one type of non-linearity that may arise in unit-cell based RF power amplifiers formed in gallium nitride based materials is third order intermodulation products that may be generated in the output signal at device turn-on in response to sharp variations in the third order transconductance of the device.

Another undesirable effect that may arise with gallium nitride based HEMT RF power amplifiers is soft gain compression. Gain compression refers to a reduction in the gain of the device (where the gain is defined as the ratio of the RF output power of the device to the RF input power) that may occur with increasing RF input power levels. The gain response for an RF power amplifier typically includes a so-called "linear region" where the gain remains relatively constant as the input power level is changed, as well as a so-called "deep compression region" where the gain drops with increasing input power level. The deep compression region of the gain response occurs at higher power levels than the linear region, and the rate of reduction in gain typically starts to increase rapidly with even small changes in input power level in the gain compression region. Depending upon the direct current biasing conditions applied to the RF amplifier, the gain response may also include an "expansion region," which is at input power levels that are lower than the input power levels for the linear region. In the expansion region, the gain increases with increasing input power. In many RF amplifiers, the gain may remain relatively stable in the region between the expansion region and the compression region. Gallium nitride based RF power amplifiers tend to suffer from an effect known as soft gain compression, which refers to a noticeable reduction in gain that occurs between the linear region and the compression region of the gain response curve. While the reduction in gain in the soft compression region is not as pronounced as the reduction in the gain compression region, it is typically large enough such that it can severely limit the RF input power levels that can be applied while keeping the amount of gain compression under a predefined value such as 1 dB or 3 dB of gain compression. In gallium nitride based RF power amplifiers, the soft compression region may be quite large, resulting in a dramatic reduction in the size of the linear region or elimination of the linear region altogether.

The sharp changes in the third order transconductance and the gate-to-source capacitance that occur at device turn-on may generate amplitude-to-amplitude modulation (AM-AM distortion) and amplitude-to-phase modulation (AM-PM distortion). Both types of distortion can lead to soft compression behavior. This, in turn, may degrade the data rates that are supportable on a communications channel that includes the gallium nitride based HEMT RF power amplifier.

As described above, by engineering the threshold voltage of the RF power amplifier so that different portions of the RF power amplifier are turned on at different levels in response to an input signal, the non-linearities caused by the sharp changes in the third order transconductance may be reduced significantly, improving the linearity of the amplifier. It has been discovered that this engineering of the threshold voltage of the RF power amplifier may likewise reduce the sharp increases in the gate-to-source capacitance that may occur at device turn-on, providing additional improvements in the linearity of the device. In effect, embodiments of the present invention provide ways of modifying the third order transconductance and the gate-to-source capacitance responses of the RF power amplifier at device turn-on in a manner that allows the non-linear mechanisms to interact and partially cancel each other out, thereby reducing the overall degree of non-linearity.

The improvement in the third order transconductance response can be seen in FIGS. 7A-7B and 15, which compare, among other things, the third order transconductance response of RF power amplifiers according to embodiments of the present invention to a comparable conventional RF power amplifier. As can be seen in FIGS. 7A-7B and 15, the third order transconductance response of the conventional RF power amplifier has a single positive peak and a single negative peak that result from the turn-on behavior of the gallium nitride based unit cell transistors. In contrast, the third order transconductance responses of the RF power amplifiers according to embodiments of the present invention have multiple positive peaks and multiple negative peaks. Multiple peaks occur because different portions of the device turn on at different levels in response to application of an input signal.

Thus, as shown in FIGS. 7A-7B and 15, embodiments of the present invention provide RF power amplifiers that include a plurality of unit cell transistors on a common wide bandgap semiconductor structure, where the unit cell transistors electrically connected in parallel, and each unit cell transistor including a respective gate finger. By, for example, engineering the threshold voltages of the unit cell transistors and/or engineering the gate voltages applied to the unit cell transistors, the unit cell transistors may be configured so that a third order transconductance response of the RF power amplifier includes at least three peaks. For example, the third order transconductance response of the RF power amplifier may include at least two positive peaks and at least two negative peaks. The positive peaks may be lower in magnitude than the positive peaks in the third order transconductance response of a comparable conventional RF power amplifier, and the negative peaks may be lower in magnitude (less negative) than the negative peaks in the third order transconductance response of a comparable conventional RF power amplifier. Additionally, the peaks may be spread out over a wider range of gate-to-source voltages. As a consequence, the third order transconductance response of the RF power amplifier may be smoothed, and the non-linearities generated by perturbations in that response may be reduced.

As can further be seen in FIGS. 7A-7B and 15, the at least two positive peaks and at least two negative peaks may all appear in the third order transconductance response at gate-to-source voltage values that are within 2 volts of a turn-on gate-to-source voltage for the device (i.e., within 2 volts of the gate-to-source voltage where the channel current starts changing from zero to a non-negligible positive value). The second positive peak may occur at a higher gate-to-source voltage level than the first positive peak, and the second positive peak may have a higher third order transconductance value than the first positive peak. The second negative peak may occur at a higher gate-to-source voltage level than the first negative peak, and the second negative peak may have a lower (i.e., more negative) third order transconductance value than the first negative peak. In some embodiments, the unit cell transistors may be configured so that a third order transconductance response of the RF power amplifier includes at least three positive peaks and at least three negative peaks.

A series of RF power amplifiers 1000 were fabricated that had the general design of the RF amplifier 400 illustrated in FIGS. 6A and 8A-8B. However, instead of fabricating each gate finger 440 to have a first region 440-1 that has a first threshold voltage and a second region 440-2 that has a second threshold voltage, each gate finger 440 included a plurality of smaller first regions 440-1 that had the first threshold voltage separated by a plurality of second regions 440-2 that had the second threshold voltage, as is schematically shown in FIGS. 18A-18B.

Figure 18A:
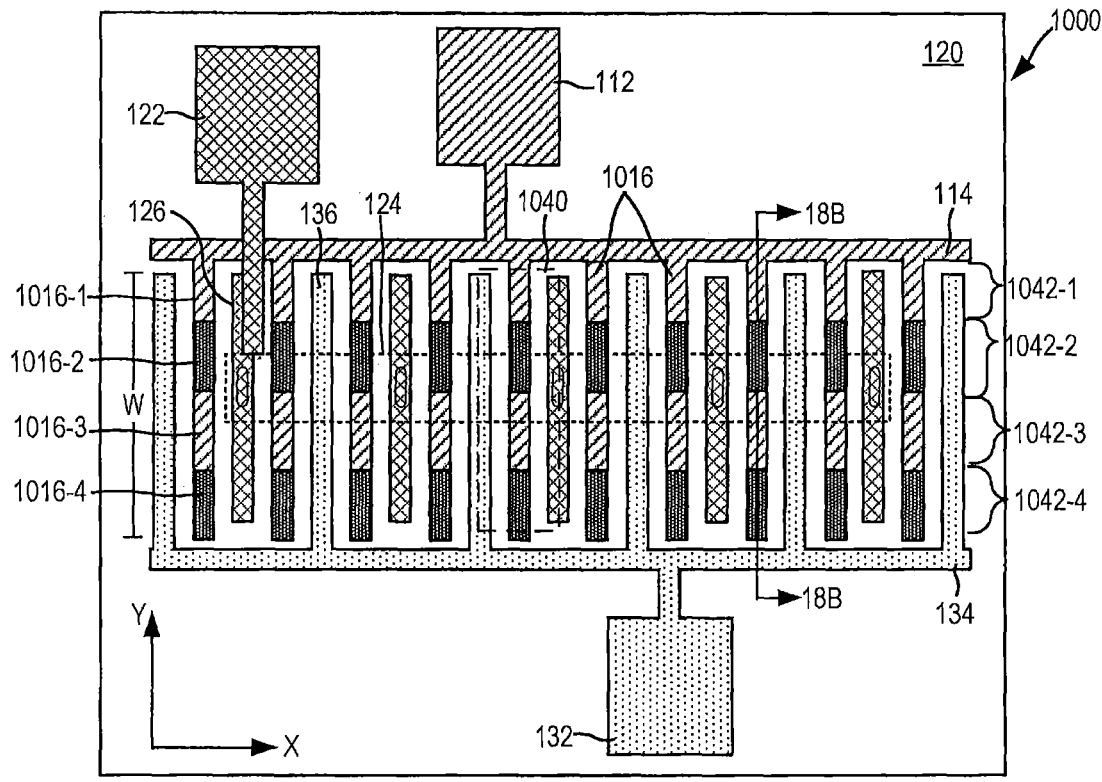
FIG. 18A is a schematic plan view of a multi-cell semiconductor device in the form of an RF power amplifier according to further embodiments of the present invention.
Figure 18B:
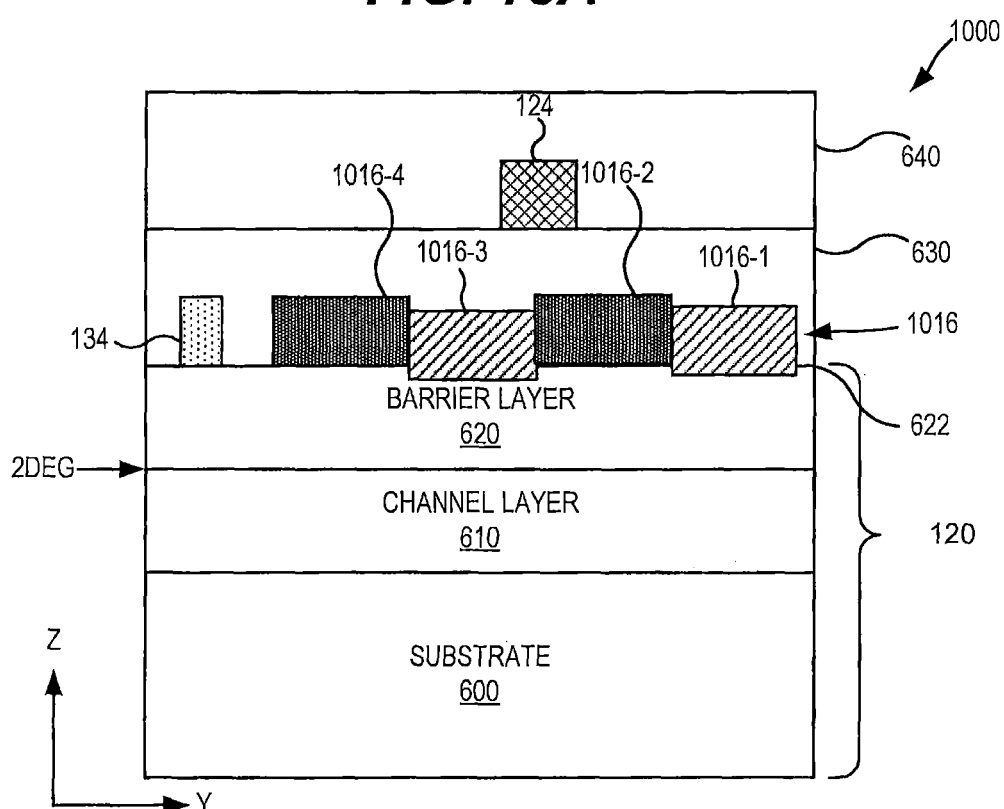
FIG. 18B is a cross-sectional view taken along line 18B-18B of FIG. 18A.

In particular, FIGS. 18A and 18B schematically illustrate a multi-cell RF power amplifier 1000 according to further embodiments of the present invention. FIG. 18A is a plan view of the RF amplifier 1000, and FIG. 18B is a cross-sectional view taken along line 18B-18B of FIG. 18A. The RF amplifier 1000 is very similar to the RF semiconductor device 400 that is discussed above with reference to FIGS. 6A and 8A-8B. Thus, the discussion below will focus on the differences between RF amplifier 1000 and RF amplifier 400.

Like the RF amplifier 400, the RF amplifier 1000 depicted in FIGS. 18A and 18B is designed to have two different threshold voltage values along the width of each gate finger 1016 thereof. However, in RF amplifier 1000, each gate finger 1016 is divided into more than two segments having different threshold voltages. Specifically, in the depicted embodiment, each gate finger 1016 is divided into four separate segments, 1016-1 through 1016-4, with two of the segments 1016-1, 1016-3 having the first threshold voltage $V_{TH\text{-}1}$ and the other two segments 1016-2, 1016-4 having the second threshold voltage $V_{TH\text{-}2}$. Thus, each unit cell transistor 1040 of RF amplifier 1000 may be viewed as having four separate sections, namely first and third sections 1042-1, 1042-3 that have the first threshold voltage value $V_{TH\text{-}1}$ and second and fourth sections 1042-2, 1042-4 that have the second threshold voltage value $V_{TH\text{-}2}$. In the depicted embodiment, the second threshold voltage $V_{TH\text{-}2}$ is greater than the first threshold voltage $V_{TH\text{-}1}$. The variation in threshold voltage is provided by forming recesses 622 in the gallium nitride based barrier layer 620 underneath the first and third segments 1016-1, 1016-3 of each gate finger 1016, as shown in FIG. 18B.

A total of four wafers were fabricated, and each wafer included four RF power amplifiers having the general design of the RF amplifier 1000 of FIGS. 18A-18B. The sixteen RF power amplifiers included on these four wafers differed, however, in terms of (1) the depth of recesses 622 in the barrier layer 620 (which impacts the difference between the first threshold voltage $V_{TH\text{-}1}$ and the second threshold voltage $V_{TH\text{-}2}$) and (2) the percentages of each gate finger that had the first threshold voltage $V_{TH\text{-}1}$ and the second threshold voltage $V_{TH\text{-}2}$. A total of four different depths for the recesses 622 were used, namely recess depths of 4 nm, 6 nm, 8 nm and 10 nm. Likewise, the gate fingers in each RF power amplifier were designed so that the portion of the active region of each gate finger 1016 that had the first threshold voltage $V_{TH\text{-}1}$ varied.

Herein, the sum of the widths of the active portions of the gate fingers 1016 (wherein the active portion of a gate finger 1016 refers to the portion that is between a corresponding drain finger and a corresponding source finger) is referred to as the "gate periphery" of the RF power amplifier 1000. Thus, referring to FIG. 18A, the gate periphery for the RF power amplifier depicted therein would be 10*W, since the amplifier 1000 includes a total of 10 gate fingers 1016 and the width of the active portion of each gate finger 1016 is W. As noted above, in each of the experimental RF power amplifiers 1000 that were fabricated, a different percentage of the total gate finger length (i.e., a different percentage of the gate periphery) had the first threshold voltage $V_{TH\text{-}1}$. In particular, in four of the RF power amplifiers 1000, 45% of the gate periphery had the first threshold voltage $V_{TH\text{-}1}$ (and the remaining 55% of the gate periphery had the second threshold voltage $V_{TH\text{-}2}$), in another four of the RF power amplifiers 1000, 50% of the gate periphery had the first threshold voltage $V_{TH\text{-}1}$ (and the remaining 50% of the gate periphery had the second threshold voltage $V_{TH\text{-}2}$), in another four of the RF power amplifiers 1000, 55% of the gate periphery had the first threshold voltage $V_{TH\text{-}1}$ (and the remaining 45% of the gate periphery had the second threshold voltage $V_{TH\text{-}2}$), and in the final four of the RF power amplifiers 1000, 100% of the gate periphery had the second threshold voltage $V_{TH\text{-}2}$. The performance of these sixteen RF power amplifiers was compared to the performance of a conventional RF power amplifier in which 100% of the gate periphery had the first threshold voltage $V_{TH\text{-}1}$ (i.e., the barrier layer 620 did not include any recesses 622). The table below shows the characteristics of the sixteen experimental RF power amplifiers 1000 that were fabricated, which are labelled 1000A through 1000P for convenience. The conventional RF power amplifier is labelled 1000Q.

| RF Amplifier | Depth of Recess (nm) | Percentage of Gate Periphery Having $V_{TH\text{-}2}$ |
|---|---|---|
| 1000A | 4 | 45% |
| 1000B | 6 | 45% |
| 1000C | 8 | 45% |
| 1000D | 10 | 45% |
| 1000E | 4 | 50% |
| 1000F | 6 | 50% |
| 1000G | 8 | 50% |
| 1000H | 10 | 50% |
| 1000I | 4 | 55% |
| 1000J | 6 | 55% |
| 1000K | 8 | 55% |
| 1000L | 10 | 55% |
| 1000M | 4 | 100% |
| 1000N | 6 | 100% |
| 1000O | 8 | 100% |
| 1000P | 10 | 100% |
| 1000Q | 0 | 0% |

Figure 19A:
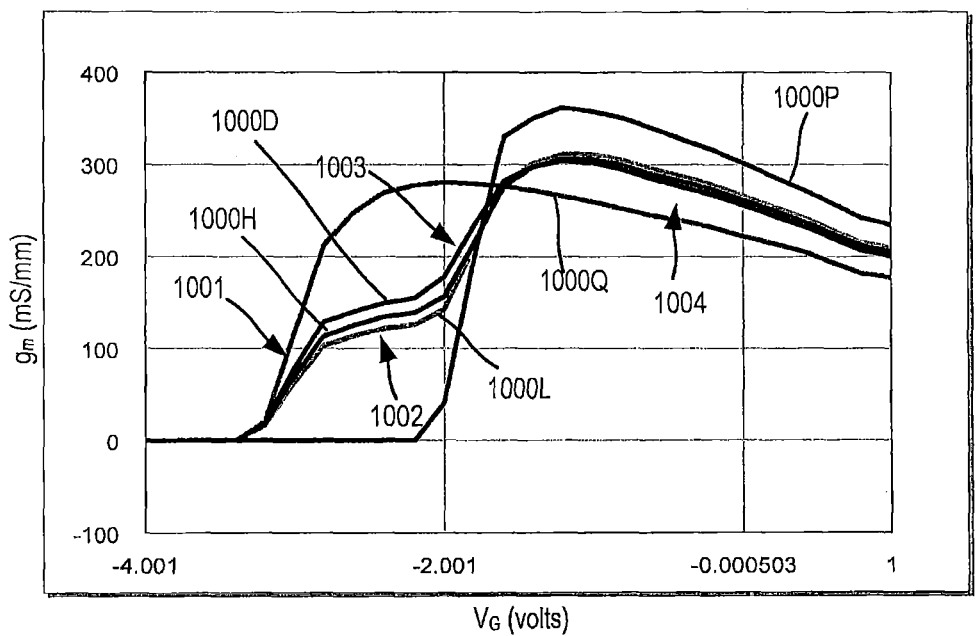
FIG. 19A is a graph that illustrates the measured transconductance at device turn-on for a direct current signal for four RF power amplifiers according to embodiments of the present invention as compared to the transconductance at device turn-on for a conventional RF power amplifier.

FIG. 19A is a graph that illustrates the measured transconductance at device turn-on for the four RF amplifier designs that included a 10 nm recess 622 in the barrier layer 620, namely RF power amplifiers 1000D, 1000H, 1000L and 1000P as compared to the conventional RF power amplifier 1000Q. As shown in FIG. 19A, the conventional RF power amplifier 1000Q exhibits a rapid increase in transconductance as soon as the input gate signal reaches the threshold voltage for the device (about −3 volts) and then peaks at about −2 volts. After reaching this peak, the transconductance slowly decreases. The RF amplifier design 1000P in which 100% of the gate periphery is implemented using recessed gate fingers illustrates similar transconductance behavior at device turn-on, except that the curve is shifted to the right (since RF amplifier design 1000P turns on at a threshold voltage of about −2 volts due to the recessed gate fingers), and the overall increase in transconductance is larger.

As is also shown in FIG. 19A, RF power amplifiers 1000D, 1000H and 1000L exhibit a significantly different transconductance response at device turn-on. In particular, for each of these RF power amplifiers 1000D, 1000H and 1000L, the transconductance response at device turn-on has a first region 1001 in which the transconductance increases fairly rapidly, albeit at a rate that is less than the rate of increase seen in the same region 1001 for the conventional RF power amplifier 1000Q. The first region 1001 generally corresponds to transconductance values from about 0-100 mS/mm. The rate of increase in the transconductance exhibited by RF power amplifiers 1000D, 1000H and 1000L then decreases significantly with increasing gate voltage in a second region 1002 that generally corresponds to transconductance values of about 100-160 mS/mm.

The transconductance response then exhibits a relatively sharp increase in a third region 1003 corresponding to transconductance values of about 160-300 mS/mm, at which point the transconductance reaches a peak. Thereafter, in a fourth region 1004, the transconductance slowly decreases in a manner similar to the transconductance for the conventional RF power amplifier 1000Q. It should be noted that the peak transconductance value for RF power amplifiers 1000D, 1000H and 1000L is actually higher than the peak transconductance value for the conventional RF power amplifier 1000Q. However, the increase in the transconductance is spread out over a wider range of applied gate voltages, meaning that the increase in transconductance will occur more slowly at device turn-on.

The difference between the transconductance response of RF power amplifiers 1000D, 1000H and 1000L and the transconductance response of the conventional RF power amplifier 1000Q may be attributed to the fact that different parts of the gate periphery turn on at different levels in response to application of a gate voltage to the RF power amplifiers 1000D, 1000H and 1000L. As a result, the transconductance ramps up both more slowly (i.e., the slope is reduced) and to a lesser degree in region 1001 as compared to the conventional RF power amplifier 1000Q, and then in region 1002 the rate of increase in the transconductance for RF power amplifiers 1000D, 1000H and 1000L starts to plateau as the first and third sections 1042-1, 1042-3 of each unit cell transistor 1040 turn on, while the second and fourth sections 1042-2, 1042-4 of each unit cell transistor 1040 remain in a substantially off state. As the voltage is increased further, the second and fourth sections 1042-2, 1042-4 of each unit cell transistor 1040 start to turn-on, and the transconductance again starts to increase at a faster rate. While the transconductance of RF power amplifiers 1000D, 1000H and 1000L eventually reaches similar (and actually slightly higher values) as compared to the transconductance of the conventional RF power amplifier 1000Q, the threshold voltage engineering acts to insert a plateau into the transconductance response curve (section 1002) so that the sharp increase in the transconductance that occurs in the conventional RF power amplifier 1000Q at turn-on is reduced, and the gate voltage must be raised about a volt higher until the peak transconductance value is reached.

Figure 19B:
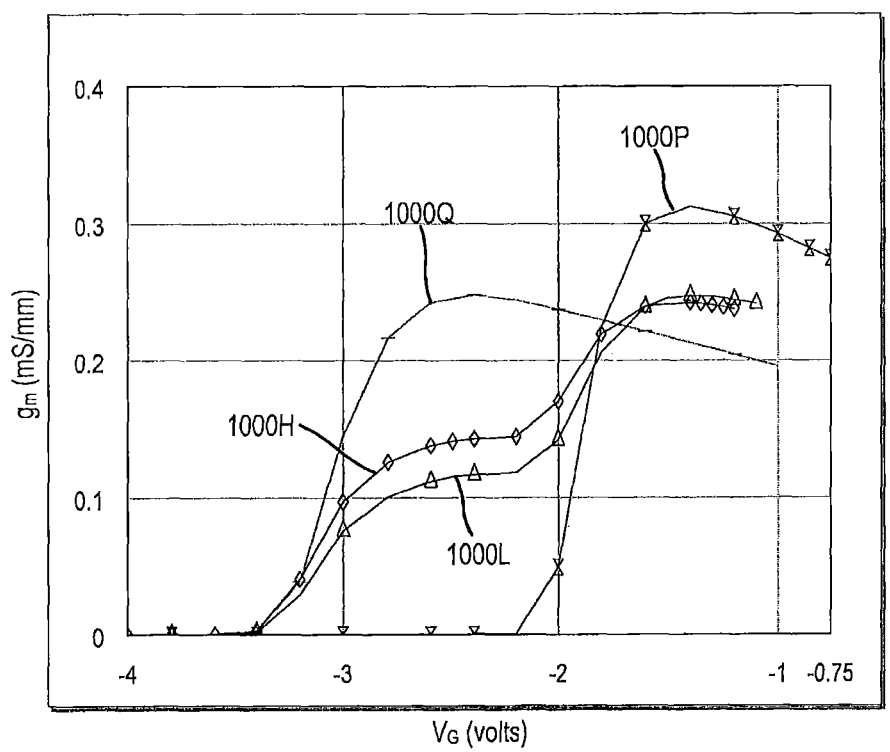
FIG. 19B is a graph that illustrates the measured transconductance at device turn-on for an RF signal for the four RF power amplifiers that were used to generate the graph of FIG. 19A as compared to the transconductance at device turn-on for the conventional RF power amplifier.

FIG. 19A illustrates the transconductance response for a DC input signal. FIG. 19B provides identical data as FIG. 19A, except that in the case used to generate the graph of FIG. 19B both the DC input signal and a small RF signal were applied to the RF power amplifier. As can be seen, the transconductance response curves obtained by linearly extraction of the small RF signal as shown in FIG. 19B have the same shape as the transconductance response curves in FIG. 19A. Note that the curve for RF power amplifier 1000D was omitted in FIG. 19B.

Figure 20:
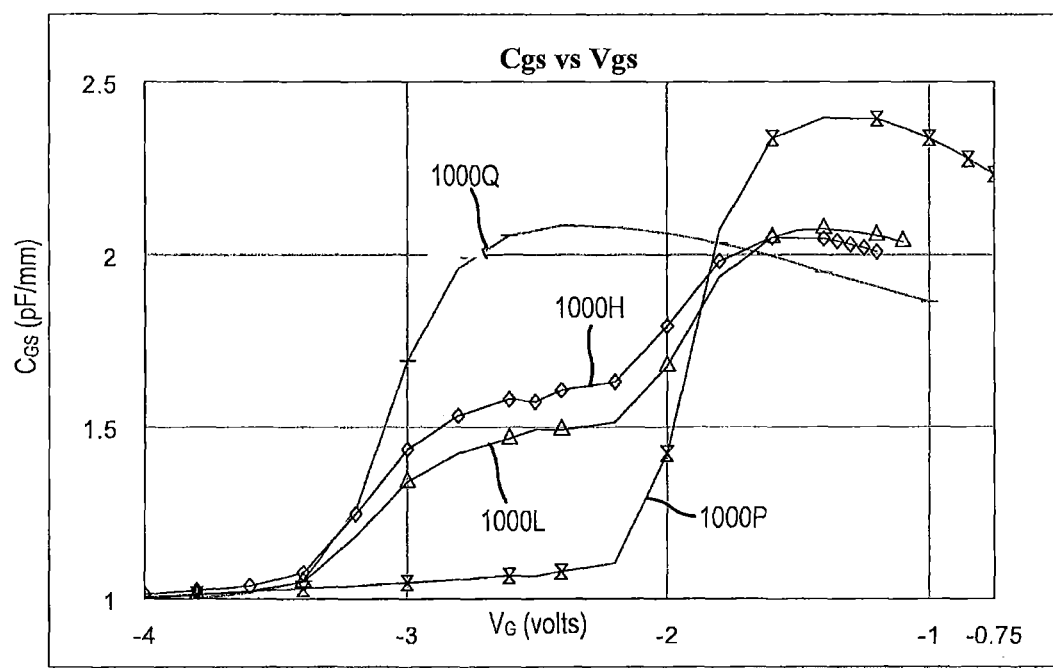
FIG. 20 is a graph of the measured gate-to-source capacitance at device turn-on for several RF power amplifiers according to embodiments of the present invention as compared to the gate-to-source capacitance at device turn-on for a conventional RF power amplifier.

FIG. 20 is a graph that illustrates the gate-to-source capacitance at device turn-on for RF power amplifiers 1000H, 1000L and 1000P (each of which include 10 nm recesses 622) as compared to the gate-to-source capacitance at device turn-on for the conventional RF amplifier 1000Q. The graphs shown in FIG. 20 were obtained by linear extraction of the RF signal. As shown in FIG. 20, all four gate-to-source capacitance response curves exhibit similar shape to the corresponding transconductance curves illustrated in FIGS. 19A and 19B. Thus, it can be seen that the threshold voltage engineering also provides a plateau in the gate-to-source capacitance response which results because only about half of the gate periphery turns on at a first level, while the other half turns on at a second, lower level in response to an input signal).

Because of intrinsic characteristics of semiconductor materials, including decreasing electron velocity with increasing charge density, RF power amplifiers tend to suffer from gain compression. As discussed above, soft gain compression refers to the situation where significant gain compression starts to occur at relatively low input power levels. Unlike RF power amplifiers formed in certain other semiconductor materials, gallium nitride based RF power amplifiers tend to suffer from soft gain compression. Due to linearity requirements, many applications for RF power amplifiers require less than 3 dB in "gain compression," which refers to the acceptable amount of variance in the gain over the operating range for the amplifier. Other RF power amplifiers have even tighter linearity requirements, requiring, for example, less than 1 dB in gain compression.

Figure 21:
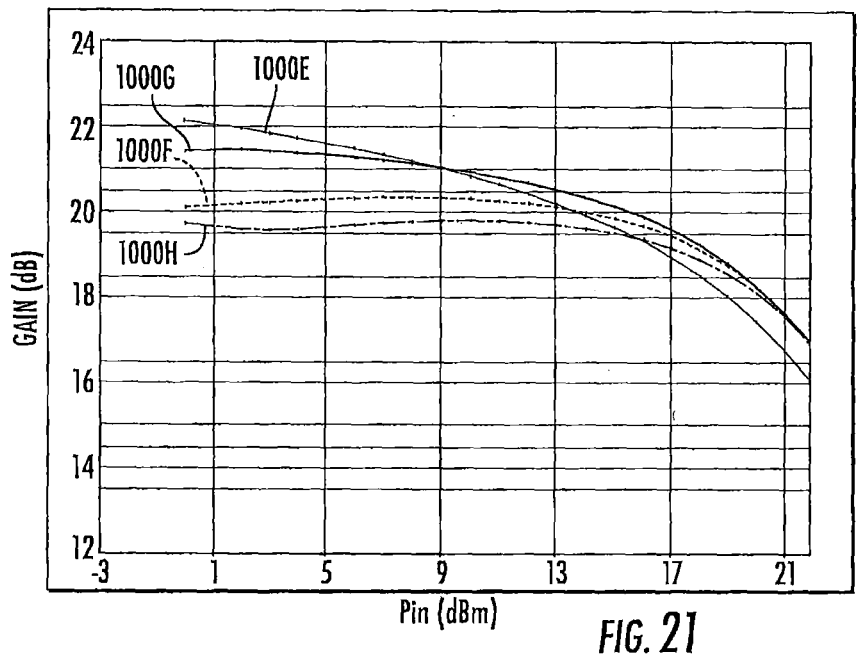
FIG. 21 is a graph of the gain response curves for four RF power amplifiers according to embodiments of the present invention.

FIG. 21 is a graph that illustrates the gain characteristics of RF power amplifiers 1000E, 1000F, 1000G and 1000H. Thus, the plots included in FIG. 21 correspond to the RF power amplifiers in which 50% of the gate periphery was formed with recessed gate fingers, at four different recess depths (4 nm, 6 nm, 8 nm and 10 nm, respectively). As can be seen from FIG. 21, the deeper the recesses 622, the lower the maximum gain of the RF power amplifier. Thus, the threshold engineering performed in the RF power amplifiers according to embodiments of the present invention may result in a reduction in one of the important performance parameters of the RF power amplifier. FIG. 21 also shows that the smaller the recess depth, the greater the amount of gain compression. For example, when the segments 1016-1, 1016-3 of the gate finger 1016 are only recessed 4 nm into the gallium nitride based barrier layer, 1 dB of gain compression is reached at an input power level of less than 9 dBm. When the segments 1016-1, 1016-3 of the gate finger 1016 are recessed 6 nm into the gallium nitride based barrier layer, 1 dB of gain compression is reached at an input power level of about 11 dBm. When the segments 1016-1, 1016-3 of the gate finger 1016 are recessed 8 nm into the gallium nitride based barrier layer, 1 dB of gain compression is reached at an input power level of about 16 dBm. When the segments 1016-1, 1016-3 of the gate finger 1016 are recessed the full 10 nm into the gallium nitride based barrier layer, 1 dB of gain compression is reached at an input power level of about 19 dBm. Moreover, the similarity of the gain response curves for the RF power amplifiers 1000G and 1000H suggests that some degree of process variation may be tolerated without significant impact on device performance. As the RF power amplifier having the 10 nm recesses 622 clearly provides the best linearity, the discussion below will focus on RF power amplifiers that have 10 nanometer recesses 622.

Figure 22:
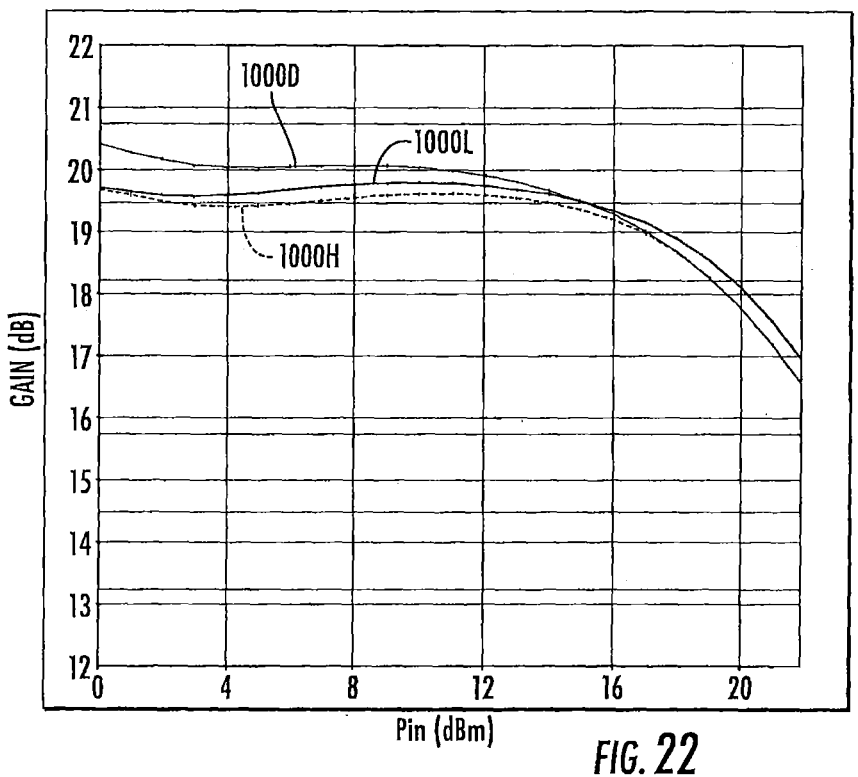
FIG. 22 is a graph illustrating how the percentage of the gate periphery that is recessed impacts the gain performance of the RF power amplifiers according to embodiments of the present invention.

FIG. 22 is a graph that illustrates how the percentage of the gate periphery that is recessed impacts the gain performance of the RF power amplifiers according to embodiments of the present invention. In particular, FIG. 22 shows the gain as a function of RF input power for RF power amplifiers 1000D, 1000H and 1000L. As shown in FIG. 22, RF power amplifier 1000L, which has 55% of the gate periphery recessed, provides the best linearity, and also provides a slight increase in gain as compared to the RF power amplifier 1000H (which has 50% of the gate periphery recessed). Based on these results, it is anticipated that, in some cases, the gain performance may be further improved by further increasing the portion of the gate periphery that has recessed gate fingers (or other techniques that are used to modify the threshold voltage along a portion of the gate periphery), with percentages of 60%, 65% or even 70% of the gate periphery potentially providing further improvements. Preliminary modeling results indicate that in some embodiments that have two different threshold voltage levels, optimum performance may be obtained if 55%-65% of the gate periphery has the higher threshold voltage and 35%-45% of the gate periphery has the lower threshold voltage. Embodiments of the present invention, however, are not limited thereto, and it will be appreciated that the optimum percentages may vary based on application, material system and other parameters. It will also be appreciated that at a percentage of 100%, the linearity of the gain curve will be significantly worse than what is shown in FIG. 22.

The shape of the gain response for an RF power amplifier changes with changes in the DC bias condition of the device. Generally speaking, at low bias current values (e.g., DC drain-to-source currents of less than 10 mA/mm for a gallium nitride based HEMT RF power amplifier), the RF power amplifier will exhibit gain expansion (i.e., increasing gain with increasing input power level) for a range of lower input power levels followed by deep gain compression behavior (i.e., decreasing gain with increasing input power level) as the input power is increased further. As the bias current is increased, the gain response becomes flatter at low input power levels (as opposed to exhibiting gain expansion), and as the bias current levels are increased even further the RF power amplifier may exhibit soft gain compression even at very low input power levels. RF power amplifiers often have fairly stringent linearity requirements, such as a variation in gain of less than 1 dB, 2 dB or 3 dB. To meet such linearity requirements, conventional RF power amplifiers would have to be operated in the relatively narrow range of DC bias current levels that have a flat gain response at lower input power levels, as this was the only way to provide sufficiently linear performance. As a result, other performance parameters such as efficiency, power density and/or the maximum gain of the RF power amplifier tended to be compromised in order to operate the RF power amplifier in the bias current level range that was necessary to meet the linearity requirements.

By, for example, engineering the threshold voltage of the RF power amplifier so that different regions of the RF power amplifier turn on at different levels, it has been discovered that the flatness of the gain response at lower input power levels may be significantly improved over a wide range of bias current levels. Thus, at both low bias current levels and at high bias current levels, the magnitude of both gain expansion and gain compression are significantly reduced. Since good linearity may be achieved over a much larger range of bias current levels, the need to compromise other performance parameters in order to meet linearity requirements may be reduced or eliminated.

Figure 23A:
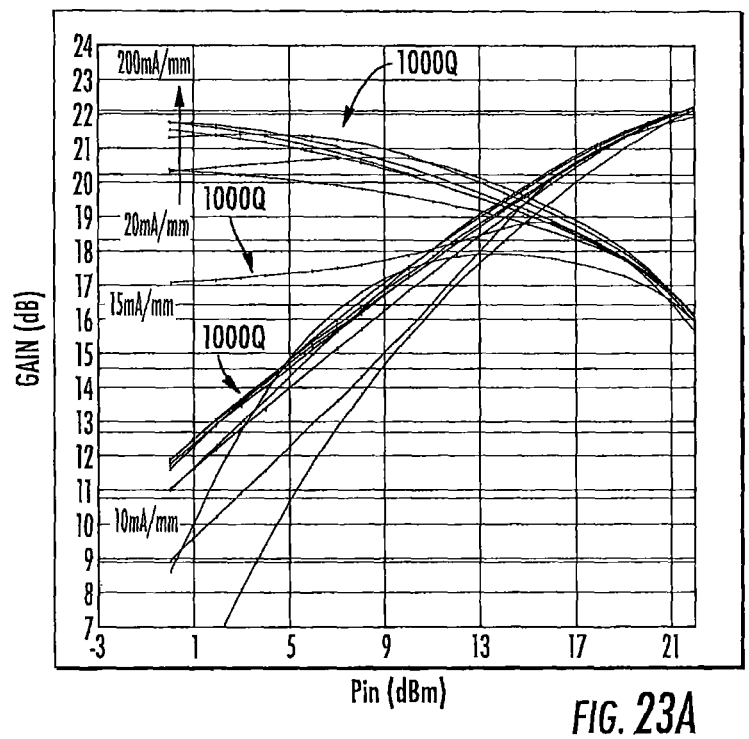
FIG. 23A is a graph illustrating the gain performance of a conventional RF power amplifier over a range of different bias current levels.
Figure 23B:
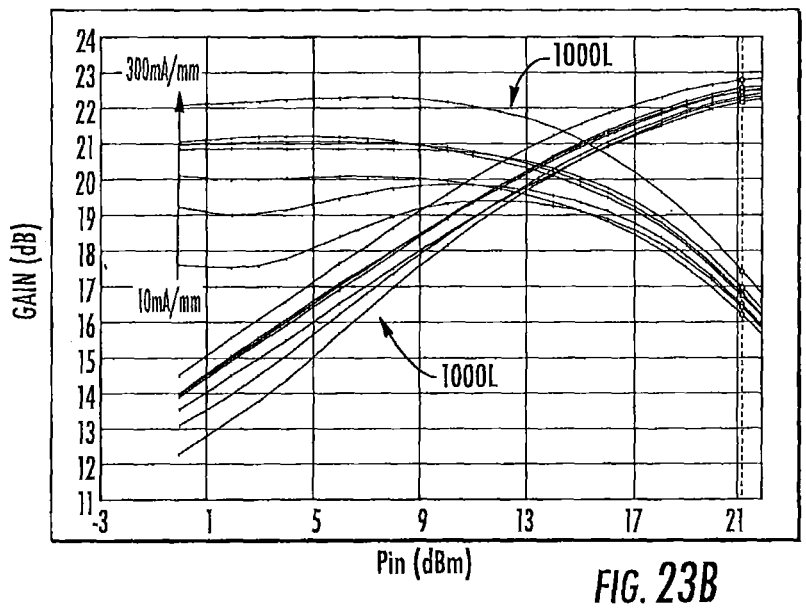
FIG. 23B is a graph illustrating the gain performance of an RF power amplifier according to embodiments of the present invention over a range of different bias current levels.

FIGS. 23A and 23B are graphs that illustrate the gain performance of RF power amplifier 1000L operated at various bias current conditions as compared to the gain performance of the conventional RF power amplifier 1000Q operated under the same bias current conditions. As shown in FIG. 23A, conventional RF power amplifiers having the design of RF power amplifier 1000Q exhibit different gain responses depending upon the bias current level. At low bias current levels (e.g., bias currents of about 10 mA/mm or less), the RF power amplifier 1000Q operates under gain expansion for all input power levels measured. At elevated bias current levels (e.g., bias currents of about 25 mA/mm or more), the conventional RF power amplifier almost immediately starts to experience soft gain compression. Consequently, for bias current of 50 mA/mm or higher, gain compression of about 1 dB or more is seen at RF input power levels of 10 dBm, and gain compression of about 2 dB or more is seen at RF input power levels of 15 dBm.

As shown in FIG. 23B, RF power amplifiers according to embodiments of the present invention having the design of RF power amplifier 1000L operate under gain expansion at low bias current levels (e.g., bias currents of about 10 mA/mm or less) for all input power levels measured. This is similar behavior to the conventional RF power amplifiers. However, at elevated bias current levels (e.g., bias currents of about 25 mA/mm or more), the RF power amplifier 1000L exhibits a much more linear gain response (i.e., much less soft gain compression). Consequently, for bias currents between 50 mA/mm and 300 mA/mm, gain compression of less than 0.5 dB or more is seen at RF input power levels of 10 dBm, and gain compression of less than 1.0 dB is seen at RF input power levels of 15 dBm. As a result, the RF amplifier may be operated at higher bias currents and/or at higher input power levels—and hence achieving higher gain and higher output power levels—while still achieving a desired level of linearity.

Figure 24:
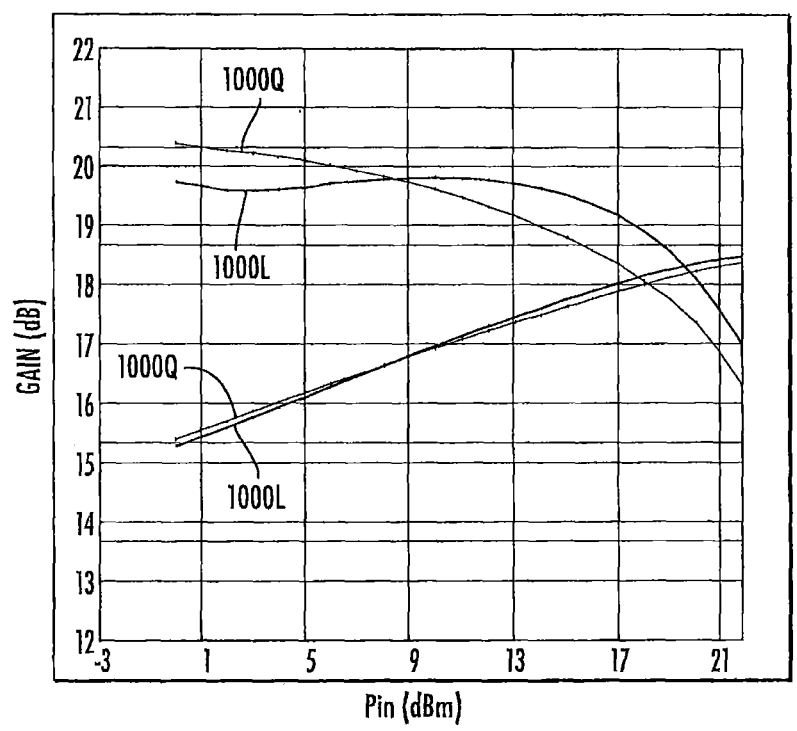
FIG. 24 is a graph illustrating the gain performance of an RF power amplifier according to an embodiment of the present invention as compared to a conventional RF power amplifier.

FIG. 24 is a graph illustrating the gain performance of an RF power amplifier according to an embodiment of the present invention (RF power amplifier 1000L) as compared to a conventional RF power amplifier (RF power amplifier 1000Q). As shown in FIG. 24, the gain of the RF power amplifier 1000L exhibits a slight decrease with increasing input power level for input power levels in the range of about 0-3 dBm, and then exhibits a slight increase in gain with increasing input power level for input power levels in the range of about 3-11 dBm. The slight decrease that is seen at low input power levels may be due to measurement accuracy, and thus the true response may actually be a monotonically increasing gain response for input power levels from 0-11 dBm, which is due to gain expansion. For input power levels above about 11 dBm, the gain once again decreases with increasing input power level, first experiencing soft compression and then decreasing rapidly at input power levels above about 17-19 dBm as the amplifier enters into the compression region.

FIG. 24 clearly shows that RF power amplifier 1000L exhibits a significant improvement in gain compression performance as compared to RF power amplifier 1000Q at high bias current levels. In particular, when operated at a higher bias current level, the conventional RF power amplifier 1000Q reaches a 1 dB gain compression level at an RF input power of about 11 dBm. In contrast, when operated at the same elevated bias current level, RF power amplifier 1000L reaches a 1 dB gain compression level at an RF input power of about 19 dBm. Thus, the point where the gain is reduced (compressed) 1 dB from the maximum gain is pushed to a much higher input power level than is the case with the conventional RF power amplifier 1000Q. As a result, the RF power amplifier 1000L may be operated at high bias current levels and at high input power levels while still providing less than 1 dB gain compression. It should be noted that the maximum gain of the RF power amplifier 1000L is reduced as compared to the gain of the conventional RF power amplifier 1000Q by about 0.7 dB when operated at the higher bias current level. However, since the conventional RF power amplifier 1000Q can only operate at input power levels of up to about 11 dBm while providing gain compression of 1 dB or less, the RF power amplifier 1000L according to embodiments of the present invention may ultimately operate at much higher output power levels as compared to the conventional RF power amplifier 1000Q.

As can also be seen with reference to FIG. 24, even when operated at drain to source current level of greater than 50 mA/mm, RF power amplifier 1000L exhibits gain compression of less than 1 dB for RF signals having input power levels of between 0.1 dBm and 10 dBm and gain compression of less than 0.5 dB for RF signals having input power levels of between 10 dBm and 15 dBm. In contrast, the conventional RF power amplifier 1000Q, when operated at drain to source current level of greater than 50 mA/mm, exhibits gain compression of about 0.5 dB for RF signals having input power levels of 10 dBm and gain compression of more than 1.0 dB for RF signals having input power levels of 15 dBm It will be appreciated that the RF power amplifiers according to embodiments of the present invention may be configured to have the above-described improved gain response at higher bias current levels by designing the amplifier so that different portions of the device will turn on at different levels in response to application of a voltage to the gate of the transistor amplifier. In particular, the threshold voltages of different portions of the device may be engineered to be different. In some embodiments, this may be achieved by forming at least some portions of the gate fingers in recesses in a barrier layer of the device, while other portions of the gate fingers are not formed in recesses (and/or are formed in recesses having different depths). This technique may ensure that different portions of the device have different threshold voltages, and hence will turn-on at different levels in response to an input signal. In other embodiments, some of the gate fingers may be made of different materials and/or portions of the barrier layer under some portion of the gate fingers may have different material compositions and/or different doping levels in order to modify the threshold voltage in selected portions of the device.

Figure 25:
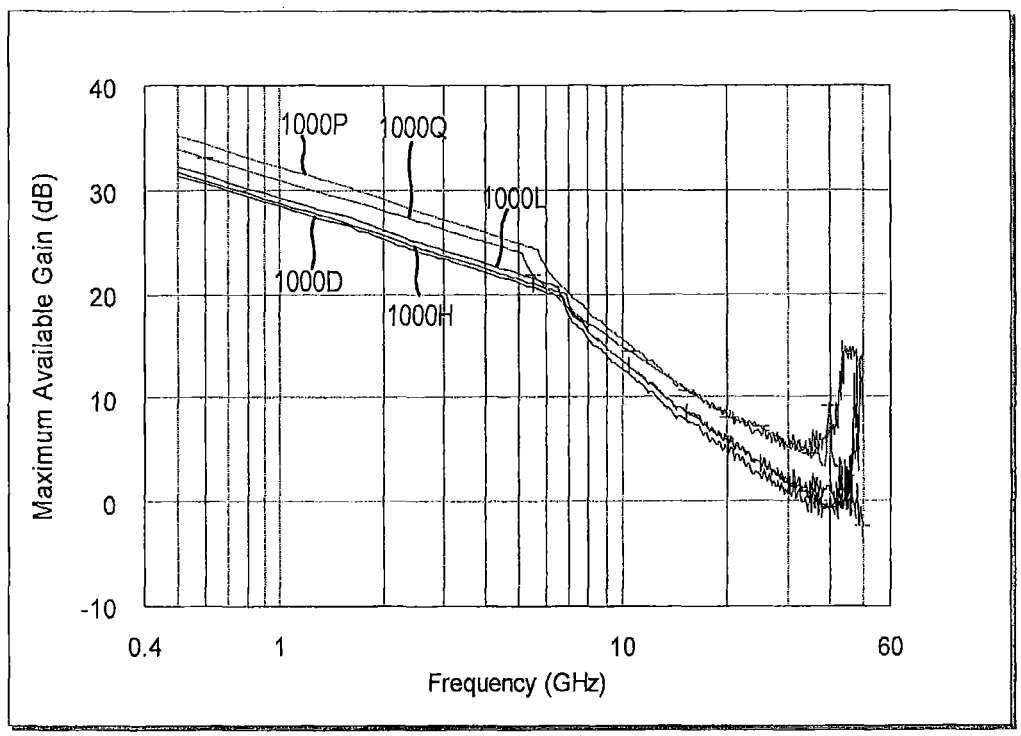
FIG. 25 is a graph that illustrates the measured maximum available gain as a function of frequency for four RF power amplifiers according to embodiments of the present invention as compared to a conventional RF power amplifier.

FIG. 25 is a graph that illustrates the measured maximum available gain as a function of frequency for RF power amplifiers 1000D, 1000H, 1000L, 1000P and 1000Q. As shown in FIG. 25, RF power amplifiers 1000P and 1000Q provide the highest gain, but these RF power amplifiers also exhibit the worst linearity, as shown in FIG. 22. Somewhat non-intuitively, RF power amplifier 1000L, which exhibits the best linearity of all the samples evaluated, provides slightly improved gain performance as compared to RF power amplifiers 1000D and 1000H.

The RF power amplifiers according to embodiments of the present invention may also exhibit higher efficiency levels as compared to conventional RF power amplifiers. Currently, because of the sharp increase in the gate-to-source capacitance at device turn-on, it may be necessary to bias the RF power amplifier at a DC drain current level that will allow good matching between the RF power amplifier and an associated input impedance matching network. Unfortunately, the direct current drain bias current level that provides a good impedance match may be relatively high which may negatively impact the efficiency of the RF power amplifier. Since the RF power amplifiers according to embodiments of the present invention have a less sharp increase in the gate-to-source capacitance at device turn-on, the range of acceptable direct current bias currents may be increased, allowing for lower direct current bias currents (and hence more efficient RF power amplifiers) while also achieving improved linearity. In fact, preliminary results suggest that efficiency levels may be increased to about 45% from the 25% efficiency levels achieved with state-of-the-art conventional RF power amplifiers operating under substantially similar tuning conditions.

The threshold voltages at different points along the gate periphery may vary by at least 0.1 volts in some embodiments. In other embodiments, the threshold voltages at different points along the gate periphery may vary by at least 0.25 volts. In still other embodiments, the threshold voltages at different points along the gate periphery may vary by at least 0.5 volts, 0.75 volts or even 1.0 volts.

It will also be appreciated that improved performance may be achieved in some embodiments if the percentage of the device that has a first threshold voltage is different than the percentage of the device that has a second, different threshold voltage. For example, in some embodiments, the RF power amplifier may be configured to have a first portion of the gate periphery that has a first threshold voltage and a second portion of the gate periphery that has a different, second threshold voltage. The first portion may be a first percentage of the gate periphery and the second portion may be a second percentage of the gate periphery, where the second percentage exceeds the first percentage by at least five percentage points. In another embodiment, the first percentage may be no more than 45% of the gate periphery and the second percentage may be at least 55% of the gate periphery. In some embodiments, the first threshold voltage may be less than the second threshold voltage. For example, from FIGS. 19A-19B above, it can be seen that the threshold voltage for the portions of the gate fingers that are not recessed is about −3 volts, while the threshold voltage for the portions of the gate fingers that are recessed is about −2 volts. As discussed above, in some embodiments, improved performance may be achieved if the percentage of the gate periphery that has the second threshold voltage (here −2 volts) exceeds the percentage of the gate periphery that has the first threshold voltage (here −3 volts).

It will also be appreciated that the RF power amplifier may be configured to have more than two distinct threshold voltages. For example, in other embodiments, the RF power amplifier may have three distinct threshold voltages, four distinct threshold voltages or even larger numbers of distinct threshold voltages. As discussed above, the different threshold voltages may be achieved by configuring different segments of each gate finger to have different threshold voltages, by configuring different gate fingers to have different threshold voltages, or both. In embodiments that have three distinct threshold voltages, the percentage of the gate periphery that has a first of the three threshold voltages may be greater than the percentage of the gate periphery that has either the second or the third threshold voltage. For example, 35-50% of the gate periphery may have the first threshold voltage, 25-40% of the gate periphery may have the second threshold voltage, and 15-25% of the gate periphery may have the third threshold voltage. In one specific example, 50% of the gate periphery may have the first threshold voltage, 35% of the gate periphery may have the second threshold voltage, and 15% of the gate periphery may have the third threshold voltage.

The RF power amplifier may be a gallium nitride based HEMT RF power amplifier in some embodiments. The HEMT may have, for example, a gallium nitride channel layer, an aluminum gallium nitride barrier layer on the channel layer, and the gate fingers may be on the aluminum gallium nitride barrier layer opposite the gallium nitride channel layer. It will be appreciated that the channel layer and/or the barrier layer may include multiple layers, and that various other layers may also be included in the HEMT.

In embodiments where the different threshold voltages are achieved by forming recesses in the barrier layer so that a portion of the gate periphery is recessed, the thickness of the barrier layer underneath different portions of the gate fingers may vary. In some embodiments, the variation in the thickness of the barrier layer may be at least 5 nm. In other embodiments, the variation in the thickness of the barrier layer may be at least 8 nm deep. In still other embodiments, the variation in the thickness of the barrier layer may be at least 10 nm or at least 12 nm.

Pursuant to further embodiments of the present invention, methods of improving the linearity of an RF power amplifier are provided. The RF power amplifier may include a plurality of unit cell transistors that are electrically connected in parallel on a common semiconductor structure. For example, the RF power amplifier may be a gallium nitride based HEMT power amplifier. Different portions of the gate periphery of the RF power amplifier may be configured to have different threshold voltages. As a result, when a common gate signal having an increasing voltage level is applied to the respective gate fingers of the unit cell transistors, the gate-to-source capacitance of the RF power amplifier increases to a first level as a first portion of the device turns on while at least one other portion remains off. The voltage level of the common gate signal that is applied to the respective gate fingers of the unit cell transistors may then be increased further, and the gate-to-source capacitance of the RF power amplifier may remain substantially at the first level. The voltage level of the common gate signal that is applied to the respective gate fingers of the unit cell transistors may then be increased even further, which may result in the gate-to-source capacitance of the RF power amplifier increasing to a second level that is at least 1.5 times larger than the first level. This may occur as the portions of the gate periphery that have a second, higher threshold voltage turn on.

This effect may be seen with reference to FIG. 20. As shown in FIG. 20, when a common gate signal having an increasing voltage level is applied to the RF power amplifier, the gate-to-source capacitance of the RF power amplifier increases rapidly to a first level as a first portion of the device turns on while at least one other portion remains off. Then, the rate of increase in the gate-to-source capacitance decreases significantly and remains close to the first level as the gate voltage increases further, as the transistors that have turned on move toward saturation. Then, as the gate voltage is increased further, the gate-to-source capacitance of the RF power amplifier again increases rapidly again as a second portion of the device turns on.

It will be appreciated that features of the above-described embodiments may be combined in any way to create a plurality of additional embodiments.

Embodiments of the present invention are described above with reference to the accompanying drawings. The present invention may, however, be embodied in many different forms and should not be construed as limited to the embodiments described herein and/or pictured in the drawings. Rather, these embodiments are provided so that this disclosure will be thorough and complete, and will fully convey the scope of the present invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A semiconductor device, comprising:
a plurality of unit cell transistors on a semiconductor structure, the semiconductor structure including a gallium nitride based barrier layer, the unit cell transistors electrically connected in parallel, and each of the unit cell transistors including a respective gate finger; and
a voltage divider circuit that includes a first output that is coupled to the respective gate fingers of a first subset of the unit cell transistors and a second output that is coupled to the respective gate fingers of a second subset of the unit cell transistors,
wherein the first and second outputs are configured to apply first and second voltages to the respective gate fingers of the first and second subsets of the unit cell transistors, respectively,
wherein the first and second voltages differ by at least 0.1 volts.

2. The semiconductor device of claim 1, wherein the unit cell transistors of the first and second subsets of unit cell transistors have identical designs.

3. The semiconductor device of claim 1, wherein the first and second voltages differ by at least 0.25 volts.

4. The semiconductor device of claim 1, wherein the voltage divider circuit includes a third output that is coupled to the respective gate fingers of a third subset of the unit cell transistors, wherein the third output is configured to apply a third voltage to the respective gate fingers of the third subset of the unit cell transistors, the third voltage differing from both the first and second voltages by at least 0.1 volts.

5. The semiconductor device of claim 1, wherein the first and second voltages differ by between 0.1-1.25 volts.

6. The semiconductor device of claim 1, wherein the plurality of unit cell transistors and at least a portion of the voltage divider circuit are implemented on a common wafer.

7. The semiconductor device of claim 1, wherein the voltage divider circuit includes a first resistor that is disposed between a voltage source and the gate fingers of the first subset of the unit cell transistors and a second resistor that is disposed between the voltage source and the gate fingers of the second subset of the unit cell transistors.

8. The semiconductor device of claim 7, wherein a first inductor is provided in series with the first resistor and a second inductor is provided in series with the second resistor.

9. The semiconductor device of claim 8, wherein the first and second resistors and the plurality of unit cell transistors are implemented on a common wafer.

10. The semiconductor device of claim 9, wherein the first and second inductors are also implemented on the common wafer.

11. A semiconductor device, comprising:
a wafer having a gallium nitride based layer;
a plurality of unit cell transistors on/in the wafer, the unit cell transistors electrically connected in parallel and each of the unit cell transistors including a respective gate finger; and
a voltage divider circuit that is at least partially on the wafer, the voltage divider circuit including a first output that is coupled to gate fingers of a first subset of the unit cell transistors, a second output that is coupled to gate fingers of a second subset of the unit cell transistors, and a first resistor that is coupled between the first output and the second output.

12. The semiconductor device of claim 11, wherein the voltage divider circuit further includes a first inductor that is electrically coupled in series with the first resistor.

13. The semiconductor device of claim 11, wherein the voltage divider circuit further includes a direct current voltage source and a first inductor that is provided between the direct current voltage source and the first output, where the first inductor is implemented off of the wafer.

14. The semiconductor device of claim 12, wherein the first inductor comprises a meandered conductive line on the wafer.

15. The semiconductor device of claim 11, wherein the voltage divider circuit further includes a third output that is coupled to gate fingers of a third subset of the unit cell transistors and a second resistor that is coupled between the second output and the third output.

16. The semiconductor device of claim 15, wherein the voltage divider circuit further includes a second inductor that is electrically coupled in series with the second resistor.

17. The semiconductor device of claim 11, wherein the first resistor comprises an oxidized portion of a conductive line.

18. The semiconductor device of claim 11, wherein the first and second outputs are configured to apply first and second voltages to the gate fingers of the first and second subsets of the unit cell transistors, respectively, wherein the first and second voltages differ by at least 0.5 volts.

19. The semiconductor device of claim 15, wherein the voltage divider circuit further includes a first inductor that is electrically coupled in series with the first resistor and a second inductor that is electrically coupled in series with the second resistor.

20. The semiconductor device of claim 11, wherein the unit cell transistors of the first and second subsets of unit cell transistors have identical designs.

\* \* \* \* \*

UNITED STATES PATENT AND TRADEMARK OFFICE
CERTIFICATE OF CORRECTION

| | |
|---|---|
| PATENT NO. | : 12,034,072 B2 |
| APPLICATION NO. | : 17/190559 |
| DATED | : July 9, 2024 |
| INVENTOR(S) | : Liu et al. |

It is certified that error appears in the above-identified patent and that said Letters Patent is hereby corrected as shown below:

On the Title Page

(54) Title: Please correct "SEMICONDUCTOR DEVICES HAVING UNIT CELL TRANSISTORS WITH SMOOTHED TURN-ON BEHAVIOR AND IMPROVED LINEARITY" to read --SEMICONDUCTOR DEVICES HAVING A PLURALITY OF UNIT CELL TRANSISTORS THAT HAVE SMOOTHED TURN-ON BEHAVIOR AND IMPROVED LINEARITY--

In the Specification

Column 1, Lines 1-4: Please correct "SEMICONDUCTOR DEVICES HAVING UNIT CELL TRANSISTORS WITH SMOOTHED TURN-ON BEHAVIOR AND IMPROVED LINEARITY" to read --SEMICONDUCTOR DEVICES HAVING A PLURALITY OF UNIT CELL TRANSISTORS THAT HAVE SMOOTHED TURN-ON BEHAVIOR AND IMPROVED LINEARITY--

Column 16, Line 24: Please correct "1021" to read --102$_1$--

Column 16, Line 26: Please correct "1022" to read --102$_2$--

Column 16, Line 27: Please correct "1021" to read --102$_1$--

Column 16, Line 31: Please correct "1022" to read --102$_2$--

Column 16, Line 37: Please correct "1021 and 1022" to read --102$_1$ and 102$_2$--

Column 16, Line 59: Please correct "1021" to read --102$_1$--

Column 17, Line 27: Please correct "3021, 3022, . . . 302N" to read --302$_1$, 302$_2$, . . . 302$_N$--

Column 17, Line 30: Please correct "3021, 3022, . . . 302N" to read --302$_1$, 302$_2$, . . . 302$_N$--

Signed and Sealed this
Seventeenth Day of September, 2024

Katherine Kelly Vidal
*Director of the United States Patent and Trademark Office*

CERTIFICATE OF CORRECTION (continued)
U.S. Pat. No. 12,034,072 B2

Column 19, Line 34: Please correct "NiSix" to read --NiSi$_x$--

Column 20, Line 20: Please correct "7021" to read --702$_1$--

Column 20, Line 22: Please correct "7022" to read --702$_2$--

Column 20, Line 31: Please correct "7022" to read --702$_2$--

Column 24, Line 59: Please correct "voltage. four" to read --voltage.--